(12) United States Patent
Shigemori et al.

(10) Patent No.: US 12,202,375 B2
(45) Date of Patent: Jan. 21, 2025

(54) BATTERY MANAGEMENT SYSTEM

(71) Applicant: DENSO CORPORATION, Kariya (JP)

(72) Inventors: Shogo Shigemori, Kariya (JP); Takeshi Iida, Kariya (JP); Tatsuhiro Numata, Kariya (JP)

(73) Assignee: DENSO CORPORATION, Kariya (JP)

( * ) Notice: Subject to any disclaimer, the term of this patent is extended or adjusted under 35 U.S.C. 154(b) by 297 days.

(21) Appl. No.: 17/723,906

(22) Filed: Apr. 19, 2022

(65) Prior Publication Data

US 2022/0340041 A1 Oct. 27, 2022

(30) Foreign Application Priority Data

Apr. 21, 2021 (JP) ................................. 2021-072096

(51) Int. Cl.
*B60L 58/12* (2019.01)
*B60L 58/16* (2019.01)
*G01R 31/396* (2019.01)
*H01M 10/42* (2006.01)
*H02J 7/00* (2006.01)

(52) U.S. Cl.
CPC .............. *B60L 58/12* (2019.02); *B60L 58/16* (2019.02); *G01R 31/396* (2019.01); *H01M 10/425* (2013.01); *H02J 7/00032* (2020.01); *H01M 2010/4278* (2013.01)

(58) Field of Classification Search
None
See application file for complete search history.

(56) References Cited

U.S. PATENT DOCUMENTS

| 8,399,115 | B2 | 3/2013 | Ellwanger | |
|---|---|---|---|---|
| 11,203,266 | B2* | 12/2021 | Ikui | B60L 53/62 |
| 2008/0290833 | A1* | 11/2008 | Hayashi | H01M 10/482 |
| | | | | 320/137 |
| 2013/0158686 | A1* | 6/2013 | Zhang | G01C 22/006 |
| | | | | 700/91 |
| 2014/0354291 | A1* | 12/2014 | Kikuchi | H01M 10/441 |
| | | | | 324/434 |
| 2015/0119728 | A1* | 4/2015 | Blackadar | G16H 20/30 |
| | | | | 600/483 |
| 2015/0239365 | A1* | 8/2015 | Hyde | B60L 58/26 |
| | | | | 701/2 |
| 2015/0319802 | A1* | 11/2015 | Lindoff | H04W 24/02 |
| | | | | 455/422.1 |

(Continued)

FOREIGN PATENT DOCUMENTS

JP 2020-155400 A 9/2020
WO 2014/103003 A1 7/2014

*Primary Examiner* — Hunter B Lonsberry
*Assistant Examiner* — Robert L Pinkerton
(74) *Attorney, Agent, or Firm* — Posz Law Group, PLC

(57) ABSTRACT

A battery management system includes multiple monitoring devices and a control device. The monitoring devices are disposed in a housing that accommodates a battery of a vehicle and monitors battery information indicating a state of the battery. The control device performs wireless communication with each of the monitoring devices and acquires data including the battery information to execute a predetermined process. The control device sets a cycle in which the multiple monitoring devices make a round in order to perform wireless communication with each of the monitoring devices, and is capable of adjusting the cycle.

10 Claims, 15 Drawing Sheets

(56) References Cited

U.S. PATENT DOCUMENTS

| | | | | |
|---|---|---|---|---|
| 2015/0334687 | A1* | 11/2015 | Ventulett | H04M 11/04 |
| | | | | 455/419 |
| 2016/0283999 | A1* | 9/2016 | Toya | G01C 21/3679 |
| 2017/0214266 | A1* | 7/2017 | Takahashi | G01R 31/392 |
| 2017/0328956 | A1* | 11/2017 | Zhang | B60L 50/66 |
| 2017/0328997 | A1* | 11/2017 | Silverstein | G01S 7/41 |
| 2019/0159124 | A1* | 5/2019 | Cho | H04W 52/0206 |

* cited by examiner

BATTERY MANAGEMENT SYSTEM

CROSS REFERENCE TO RELATED APPLICATION

The present application claims the benefit of priority from Japanese Patent Application No. 2021-072096 filed on Apr. 21, 2021. The entire disclosure of the above application is incorporated herein by reference.

TECHNICAL FIELD

The present disclosure relates to a battery management system.

BACKGROUND

U.S. Pat. No. 8,399,115 B2 discloses a battery management system used in a vehicle. The disclosure of U.S. Pat. No. 8,399,155 B2 is incorporated herein by reference as an explanation of technical elements in the present disclosure.

SUMMARY

The present disclosure provides a battery management system including multiple monitoring devices and a control device. The monitoring devices are disposed in a housing that accommodates a battery of a vehicle and monitors battery information indicating a state of the battery. The control device performs wireless communication with each of the monitoring devices and acquires data including the battery information to execute a predetermined process. The control device sets a cycle in which the multiple monitoring devices make a round in order to perform wireless communication with each of the monitoring devices, and is capable of adjusting the cycle.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
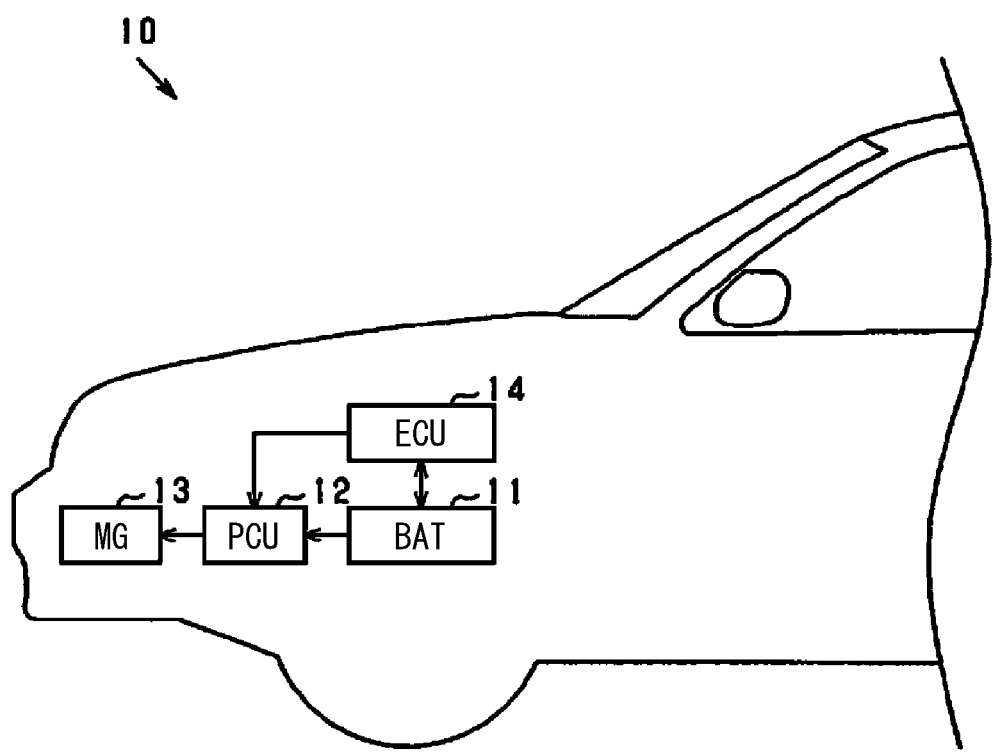
FIG. 1 is a diagram showing a vehicle equipped with a battery pack.

If disconnection occurs due to deterioration of a communication environment, there is a possibility that a battery management system cannot acquire battery information a long period of time. For example, it takes time to establish connection, and a start of acquiring battery information will be delayed. For example, power consumption during a period in which a battery state does not fluctuate significantly becomes an issue. In the above-mentioned viewpoints or in other viewpoints not mentioned, further improvements are required in the battery management system.

A battery management system according to an aspect of the present disclosure includes multiple monitoring devices and a control device. The monitoring devices are configured to be disposed in a housing that accommodates a battery of a vehicle and configured to monitor battery information indicating a state of the battery. The control device is configured to perform wireless communication with each of the monitoring devices and acquire data including the battery information to execute a predetermined process. The control device is further configured to set a cycle in which the multiple monitoring devices make a round in order to perform wireless communication with each of the monitoring devices. The control device is capable of adjusting the cycle.

According to the battery management system described above, the control device sets the cycle of wireless communication with the multiple monitoring devices and is capable of adjusting the cycle. As a result, the battery management system can have a high degree of freedom in communication.

Hereinafter, multiple embodiments will be described with reference to the drawings. The same reference numerals are assigned to the corresponding elements in each embodiment, and thus, duplicate descriptions may be omitted. When a part of the features in each embodiment is explained, the remaining part of the features may be provided by the features in other prior explained embodiments. Further, not only the combinations of the configurations explicitly shown in the description of the respective embodiments, but also the configurations of the multiple embodiments can be partially combined even when they are not explicitly shown as long as there is no difficulty in the combination in particular.

First Embodiment

First, based on FIG. 1, a vehicle equipped with a battery management system according to the present embodiment, particularly, a configuration around a battery pack provided with the battery management system will be described. FIG. 1 is a diagram showing a schematic configuration of a vehicle. The vehicle is an electric vehicle such as an electric vehicle (EV), a hybrid vehicle (HV), or a plug-in hybrid vehicle (PHV). The battery management system can also be applied to moving objects other than vehicles, such as flying objects such as drones, ships, construction machinery, agricultural machinery, and the like.

<Vehicle>

As shown in FIG. 1, a vehicle 10 includes a battery pack (BAT) 11, a PCU 12, an MG 13, and an ECU 14. PCU is an abbreviation for Power Control Unit. MG is an abbreviation for Motor Generator. ECU is an abbreviation for Electronic Control Unit.

The battery pack 11 includes an assembled battery 20, which will be described later, and provides a DC voltage source that can be charged and discharged. The battery pack 11 supplies electric power to an electric load of the vehicle 10. The battery pack 11 supplies electric power to the MG 13 through the PCU 12. The battery pack 11 is charged through the PCU 12. The battery pack 11 may be referred to as a main battery.

The battery pack 11 is disposed in a front compartment of the vehicle 10, for example, as shown in FIG. 1. The battery pack 11 may be disposed in a rear compartment, under a seat, under a floor, and the like. For example, in the case of a hybrid electric vehicle, a compartment in which an engine is disposed may be referred to as an engine compartment or an engine room.

The PCU 12 executes bidirectional power conversion between the battery pack 11 and the MG 13 according to a control signal from the ECU 14. The PCU 12 may be referred to as a power converter. The PCU 12 includes, for example, an inverter. The inverter converts the DC voltage into an AC voltage, for example, a three-phase AC voltage, and outputs the AC voltage to the MG 13. The inverter converts the generated power of the MG 13 into a DC voltage and outputs the DC voltage to a converter. The PCU 12 may include the converter. The converter is arranged in an energization path between the battery pack 11 and the inverter. The converter has a function of raising and lowering the DC voltage.

The MG 13 is an AC rotating electric machine, for example, a three-phase AC synchronous motor in which a permanent magnet is embedded in a rotor. The MG 13 functions as a traveling drive source for the vehicle 10, that is, an electric motor. The MG 13 is driven by the PCU 12 to generate a rotational driving force. The driving force generated by the MG 13 is transmitted to driving wheels. The MG 13 functions as a generator when the vehicle 10 is braked, and performs regenerative power generation. The generated power of the MG 13 is supplied to the battery pack 11 through the PCU 12 and stored in the assembled battery 20 in the battery pack 11.

The ECU 14 includes a computer including a processor, a memory, an input/output interface, a bus connecting these components, and the like. The processor is a hardware for arithmetic processing. The processor includes, for example, a CPU as a core. CPU is an abbreviation for Central Processing Unit. The memory is a non-transitional substantive storage medium that non-temporarily stores programs and data readable by a computer. The memory stores various programs executed by the processor.

The ECU 14 acquires information about the assembled battery 20 from the battery pack 11, for example, and controls the PCU 12 to control the drive of the MG 13 and the charging/discharging of the battery pack 11. The ECU 14 may acquire information such as voltage, temperature, current, SOC, and SOH of the assembled battery 20 from the battery pack 11. The ECU 14 may acquire battery information such as voltage, temperature, and current of the assembled battery 20 to calculate SOC and SOH. SOC is an abbreviation for State Of Charge. SOH is an abbreviation for State Of Health.

The processor of the ECU 14 executes multiple instructions included in, for example, a PCU control program stored in the memory. Accordingly, the ECU 14 constructs multiple functional units for controlling the PCU 12. The ECU 14 constructs multiple functional units by causing the processor to execute the multiple instructions. The ECU 14 may be referred to as an EVECU.

<Battery Pack>

Figure 2:
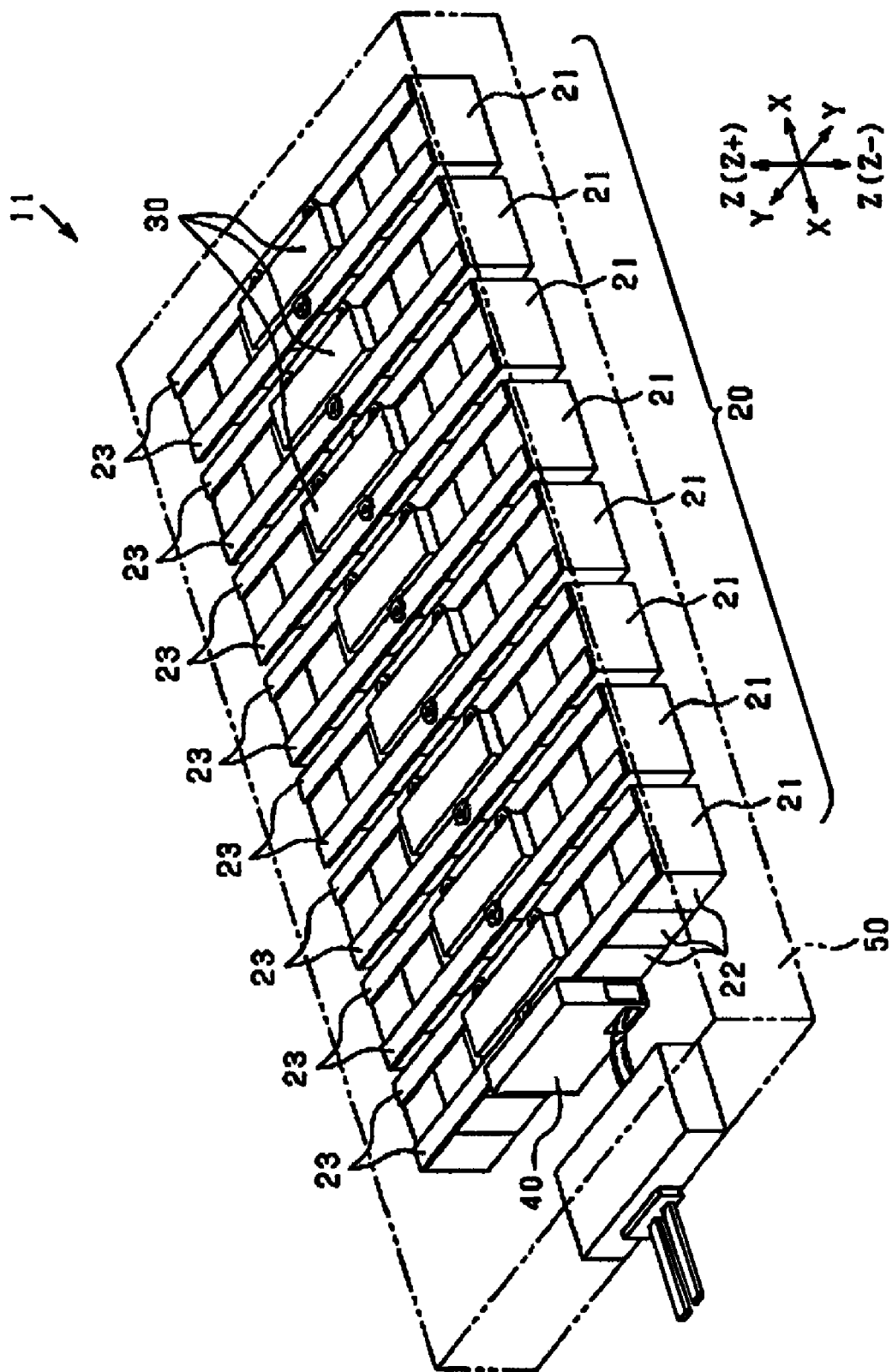
FIG. 2 is a perspective view showing a schematic configuration of the battery pack.
Figure 3:
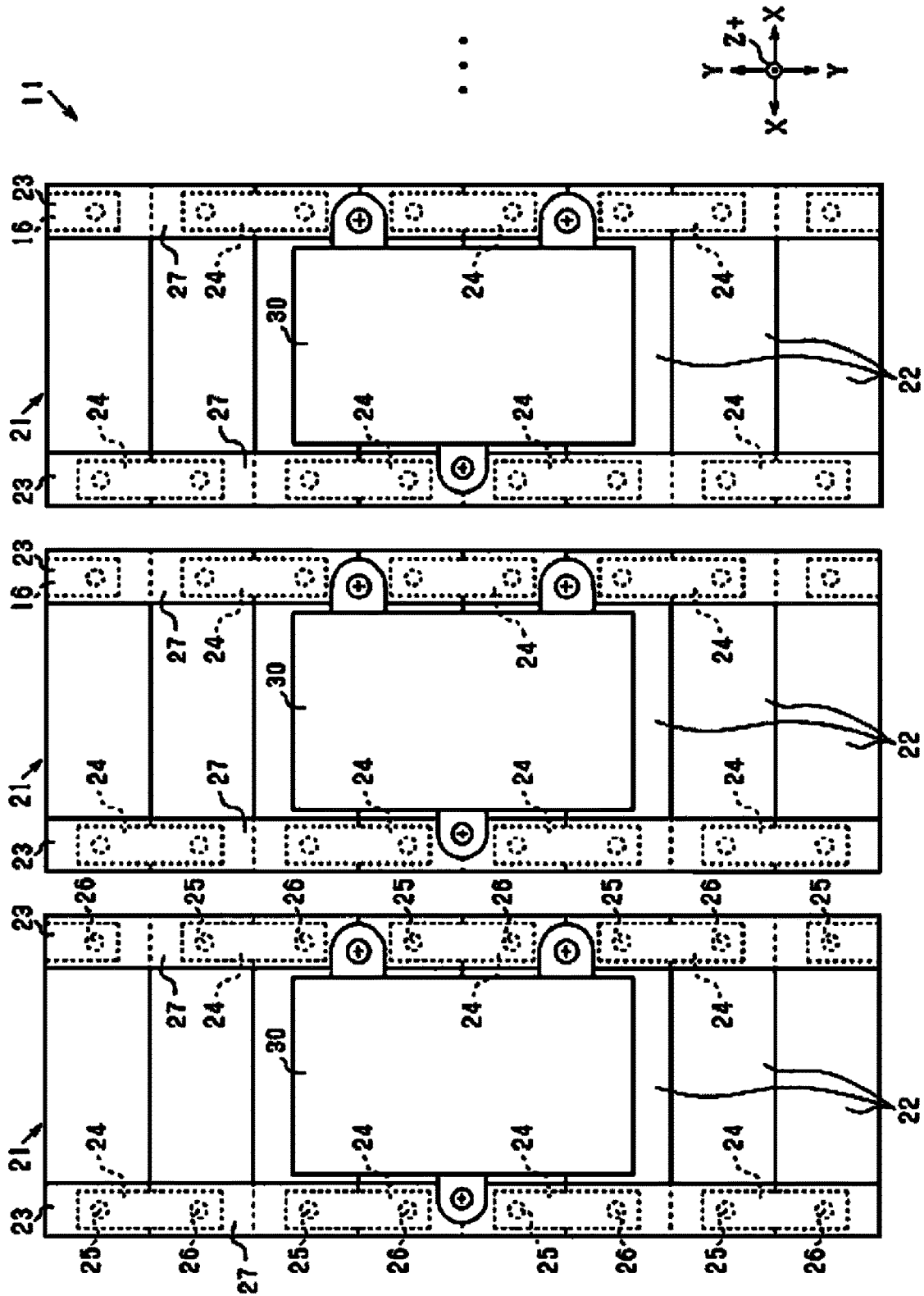
FIG. 3 is a plan view showing an assembled battery.

Next, an example of the configuration of the battery pack 11 will be described with reference to FIGS. 2 and 3. FIG. 2 is a perspective view schematically showing the inside of the battery pack 11. In FIG. 2, a housing is shown by a long dashed double-dotted line. FIG. 3 is a plan view showing an upper surface of each battery stack.

As shown in FIG. 2, the battery pack 11 includes the assembled battery 20, multiple monitoring devices 30, a control device 40, and a housing 50. The housing 50 accommodates other elements constituting the battery pack 11, that is, the assembled battery 20, the monitoring devices 30, and the control device 40. The housing 50 is made of metal, for example. The housing 50 may be made of resin, or may include a metal portion and a resin portion.

In the following, as shown in FIG. 2, among the surfaces of the housing 50 which is a substantially rectangular parallelepiped, a longitudinal direction is indicated as an X direction and a lateral direction is indicated as a Y direction on a mounting surface on the vehicle 10. In FIG. 2, a lower surface is the mounting surface. A vertical direction perpendicular to the mounting surface is referred to as a Z direction. The X direction, the Y direction, and the Z direction are in a positional relationship orthogonal to each other. In the present embodiment, a left-right direction of the vehicle 10 corresponds to the X direction, a front-rear direction corresponds to the Y direction, and the vertical direction corresponds to the Z direction. The arrangement of FIGS. 2 and 3 is only an example, and the battery pack 11 may be arranged in any way with respect to the vehicle 10.

The assembled battery 20 includes multiple battery stacks 21 arranged side by side in the X direction. The battery stack 21 may be referred to as a battery block or a battery module. The assembled battery 20 is configured by connecting the multiple battery stacks 21 in series. Each of the battery stacks 21 includes multiple battery cells 22. Each of the battery stacks 21 includes the multiple battery cells 22 connected in series. The battery stack 21 of the present embodiment is configured by connecting the multiple battery cells 22 arranged side by side in the Y direction in series. The assembled battery 20 provides the above-mentioned DC voltage source. The assembled battery 20, the battery stacks 21, and the battery cells 22 correspond to a battery.

Each of the battery cells 22 is a secondary battery that generates an electromotive voltage by a chemical reaction. As the secondary battery, for example, a lithium ion secondary battery or a nickel hydrogen secondary battery can be adopted. The lithium ion secondary battery is a secondary battery using lithium as a charge carrier. In addition to a general lithium ion secondary battery having a liquid electrolyte, a so-called all-solid-state battery using a solid electrolyte can also be included.

On the upper surface of each of the battery stacks 21, linear bus bar units 23 are arranged at both ends in the X direction. That is, a pair of bus bar units 23 are arranged in each of the battery stacks 21. The bus bar units 23 electrically connect the multiple battery cells 22. As shown in FIG. 3, each of the battery cells 22 is formed in a flat shape and is laminated so that the side surfaces overlap each other in the Y direction. Each of the battery cells 22 has positive electrode terminals 25 and negative electrode terminals 26 protruding in the Z direction, more specifically in the Z+ direction indicating upward, at both ends in the X direction. The battery cells 22 are laminated so that the positive electrode terminals 25 and the negative electrode terminals 26 are alternately arranged in the Y direction.

Each of the bus bar units 23 includes multiple bus bars 24 that electrically connect the positive electrode terminals 25 and the negative electrode terminals 26, and multiple bus bar covers 27 that covers the multiple bus bars 24. Each of the bus bars 24 is a plate material made of a metal having good conductivity such as copper. Each of the bus bars 24 electrically connects the positive electrode terminal 25 and the negative electrode terminal 26 of the adjacent battery cells 22 in the Y direction. Accordingly, in each of the battery stacks 21, the multiple battery cells 22 are electrically connected in series. In each of the battery stacks 21, the positive electrode terminal 25 of the battery cell 22 arranged on one end side in the Y direction is connected to a predetermined positive electrode wiring, and the negative electrode terminal 26 of the battery cell 22 arranged on the other end side is connected to a predetermined negative electrode wiring.

Each of the bus bar covers 27 is formed by using an electrically insulating material such as resin. The bus bar cover 27 is provided linearly from one end to the other of the battery stack 21 along the Y direction so as to cover the multiple bus bars 24.

The monitoring devices 30 are individually provided for the battery stacks 21, respectively. As shown in FIG. 2, the monitoring device 30 is arranged between the pair of bus bar units 23 in each of the battery stacks 21. The monitoring device 30 is fixed to the bus bar unit 23 with screws or the like. As will be described later, the monitoring device 30 is configured to be capable of wireless communication with the control device 40. An antenna 37 included in the monitoring device 30 is arranged so as not to overlap the bus bar unit 23 in the Z direction, that is, to protrude from the bus bar unit 23 in the Z direction.

The control device 40 is attached to an outer surface of the battery stack 21 arranged at one end in the X direction. The control device 40 is configured to be capable of wireless communication with each of the monitoring devices 30. An antenna 42 included in the control device 40 is arranged at the same height as a radio antenna 37 of the monitoring device 30 in the Z direction. That is, the antenna 42 of the control device 40 is provided so as to protrude from the bus bar units 23 in the Z direction.

In the battery pack 11, the monitoring devices 30 and the control device 40 provide a battery management system 60 described later. That is, the battery pack 11 includes the battery management system 60.

<Battery Management System>

Figure 4:
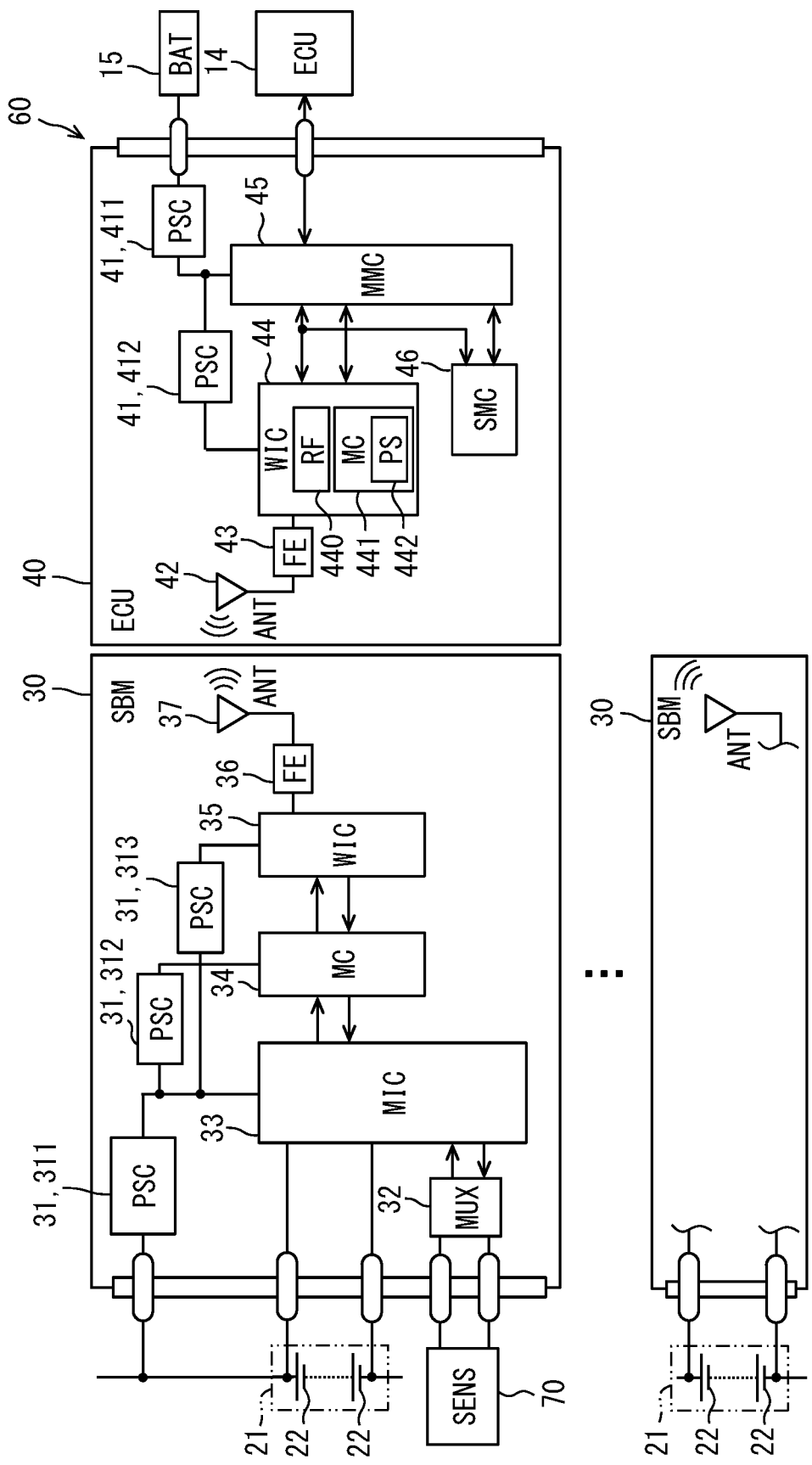
FIG. 4 is a block diagram showing a configuration of a battery management system according to a first embodiment.

Next, a schematic configuration of the battery management system will be described with reference to FIG. 4. FIG. 4 is a block diagram showing the configuration of the battery management system.

As shown in FIG. 4, the battery management system 60 includes the multiple monitoring devices (SBMs) 30 and the control device (ECU) 40. In the following, the monitoring device may be referred to as SBM. The control device 40 may be referred to as a battery ECU or a BMU. BMU is an abbreviation for Battery Management Unit. The battery management system 60 is a system that manages batteries by using wireless communication. In the battery management system 60 of the present embodiment, wireless communication is executed between the one control device 40 and the multiple monitoring devices 30. In this wireless communication, a frequency band used in short-range communication, for example, a 2.4 GHz band or a 5 GHz band is used.

<Monitoring Device>

First, the monitoring devices 30 will be described. The configurations of the monitoring devices 30 are common to each other. Each of the monitoring devices 30 includes a power supply circuit (PSC) 31, a multiplexer (MUX) 32, a monitoring IC (MIC) 33, a microcomputer (MC) 34, a wireless IC (WIC) 35, a front end circuit (FE) 36, and the antenna (ANT) 37. Communication between each element in each of the monitoring devices 30 is performed via wires.

The power supply circuit 31 uses a voltage supplied from the battery stack 21 to generate an operating power source for other circuit elements included in the monitoring device 30. In the present embodiment, the power supply circuit 31 includes power supply circuits 311, 312, and 313. The power supply circuit 311 generates a predetermined voltage using the voltage supplied from the battery stack 21 and supplies the predetermined voltage to the monitoring IC 33. The power supply circuit 312 generates a predetermined voltage using the voltage generated by the power supply circuit 311 and supplies the predetermined voltage to the microcomputer 34. The power supply circuit 313 generates a predetermined voltage using the voltage generated by the power supply circuit 311 and supplies the predetermined voltage to the wireless IC 35.

The multiplexer 32 is a selection circuit that receives detection signals of multiple sensors 70 included in the battery pack 11 and outputs the detection signals as one signal. The multiplexer 32 selects (switches) an input according to a selection signal from the monitoring IC 33 and outputs it as one signal. The sensor 70 includes a sensor for detecting a physical quantity of each of the battery cells 22 and a sensor for discriminating each of the battery cells 22, for example. The sensor for detecting the physical quantity includes, for example, a voltage sensor, a temperature sensor, a current sensor, and the like.

The monitoring IC 33 senses (acquires) battery information such as cell voltage, cell temperature, and cell discrimination through the multiplexer 32, and transmits the battery information to the microcomputer 34. The monitoring IC 33 may be referred to as a cell monitoring circuit (CSC). CSC is an abbreviation for Cell Supervising Circuit. The monitoring IC 33 may have a function of executing a failure diagnosis of a circuit portion of the monitoring device 30 including the monitoring IC 33 and transmitting a diagnosis result together with the battery information as monitoring data. When the monitoring IC 33 receives the data requesting acquisition of the battery information transmitted from the microcomputer 34, the monitoring IC 33 senses the battery information through the multiplexer 32 and transmits the monitoring data including at least the battery information to the microcomputer 34. The monitoring IC 33 corresponds to a monitoring unit.

The microcomputer 34 is a microcomputer including a CPU as a processor, a ROM and a RAM as memories, an input/output interface, and a bus connecting these elements. The CPU constructs multiple functional units by executing various programs stored in the ROM while using a temporary storage function of the RAM. ROM is abbreviation for Read Only Memory. RAM is abbreviation for Random Access Memory.

The microcomputer 34 controls a schedule of sensing and self-diagnosis by the monitoring IC 33. The microcomputer 34 receives the monitoring data transmitted from the monitoring IC 33 and transmits it to the wireless IC 35. The microcomputer 34 transmits data requesting acquisition of the battery information to the monitoring IC 33. As an example, when the microcomputer 34 of the present embodiment receives the data requesting the acquisition of the battery information transmitted from the wireless IC 35, the microcomputer 34 transmits the data requesting the acquisition of the battery information to the monitoring IC 33.

The wireless IC 35 includes an RF circuit and a microcomputer (not shown) for transmitting and receiving data wirelessly. The wireless IC 35 has a transmission function of modulating transmission data and oscillating at the frequency of an RF signal. The wireless IC 35 has a reception function for demodulating received data. RF is an abbreviation for Radio Frequency.

The wireless IC 35 modulates the data including the battery information transmitted from the microcomputer 34 and transmits it to the control device 40 via the front end circuit 36 and the antenna 37. The wireless IC 35 adds data necessary for wireless communication such as communication control information to transmission data including the battery information and transmits the transmission data. The data required for wireless communication includes, for example, an identifier (ID), an error detection code, and the like. The wireless IC 35 controls the data size, communication format, schedule, error detection, and the like of the communication between the monitoring device 30 and the control device 40.

The wireless IC 35 receives the data transmitted from the control device 40 via the antenna 37 and the front end circuit 36, and demodulates the data. When the wireless IC 35 receives, for example, data including acquisition and transmission request of the battery information, the wireless IC 35 acquires the monitoring data including the battery information through the monitoring IC 33 and transmits the monitoring data to the control device 40 as a response to the request.

The front end circuit 36 has a matching circuit for impedance matching between the wireless IC 35 and the antenna 37, and a filter circuit for removing unnecessary frequency components.

The antenna 37 converts an RF signal, which is an electric signal, into a radio wave and radiates it into space. The antenna 37 receives a radio wave propagating in space and converts it into an electrical signal.

<Control Device>

Next, the control device 40 will be described with reference to FIG. 4. The control device 40 includes a power supply circuit (PSC) 41, an antenna (ANT) 42, a front end circuit (FE) 43, a wireless IC (WIC) 44, a main microcomputer (MMC) 45, and a sub microcomputer (SMC) 46. Communication between each element in the control device 40 is performed via wires.

The power supply circuit 41 uses a voltage supplied from a battery (BAT) 15 to generate an operating power source for other circuit elements included in the control device 40. The battery 15 is a DC voltage source mounted on the vehicle 10 and different from the battery pack 11. The battery 15 may be referred to as an auxiliary battery since the battery 15 supplies electric power to an auxiliary equipment of the vehicle 10. In the present embodiment, the power supply circuit 41 includes power supply circuits 411 and 412. The power supply circuit 411 generates a predetermined voltage using the voltage supplied from the battery 15, and supplies the predetermined voltage to the main microcomputer 45 and the sub microcomputer 46. For the sake of simplification of the figure, the electrical connection between the power supply circuit 411 and the sub-microcomputer 46 is omitted. The power supply circuit 412 generates a predetermined voltage using the voltage generated by the power supply circuit 411 and supplies the predetermined voltage to the wireless IC 44.

The antenna 42 converts an RF signal, which is an electric signal, into a radio wave and radiates it into space. The antenna 42 receives a radio wave propagating in space and converts it into an electrical signal.

The front end circuit 43 has a matching circuit for impedance matching between the wireless IC 44 and the antenna 42, and a filter circuit for removing unnecessary frequency components.

The wireless IC 44 has an RF circuit (RF) 440 and a microcomputer (MC) 441 for transmitting and receiving data wirelessly. The wireless IC 44 has a transmission function and a reception function like the wireless IC 35. The wireless IC 44 receives the data transmitted from the monitoring device 30 via the antenna 42 and the front end circuit 43, and demodulates the data. Then, the wireless IC 44 transmits the monitoring data including the battery information to the main microcomputer 45. The wireless IC 44 receives the data transmitted from the main microcomputer 45, modulates the data, and transmits the modulated data to the monitoring device 30 via the front end circuit 43 and the antenna 42. The wireless IC 44 adds data necessary for wireless communication such as communication control information to the transmission data and transmits the data. The data required for wireless communication includes, for example, an identifier (ID), an error detection code, and the like. The wireless IC 44 controls the data size, communication format, schedule, error detection, and the like of communication between the monitoring device 30 and the control device 40.

The wireless IC 44 has a cycle setting unit (PS) 442. The cycle setting unit 442 sets a cycle in which the monitoring devices 30 make a round in order to perform wireless communication with each of the monitoring devices 30. The cycle may be referred to as a communication interval. The cycle setting unit 442 is capable of adjusting the cycle. The cycle setting unit 442 may, for example, change the cycle, that is, adjust the time of one cycle. The cycle setting unit 442 may adjust a data communication period and a non-communication period with each of the monitoring devices 30 in the cycle. For example, the cycle setting unit 442 may adjust the time (ratio) of the data communication period and the time of the non-communication period without changing the length of time of one cycle. The communication period is a period for communicating data such as monitoring data including the battery information with the monitoring devices 30. The non-communication period is a period excluding the data communication period with the monitoring devices 30 in the cycle.

The cycle setting unit 442 is one of functional units constructed by, for example, in the microcomputer 441, a CPU executing various programs stored in a ROM while using a temporary storage function of a RAM.

The main microcomputer 45 is a microcomputer including a CPU, a ROM, a RAM, an input/output interface, a bus connecting these elements, and the like. The ROM stores various programs executed by the CPU. The main microcomputer 45 generates a command for requesting the monitoring device 30 to process the monitoring data including the battery information, and transmits a transmission data including the command to the wireless IC 44. The main microcomputer 45 of the present embodiment generates a command requesting acquisition and transmission of the monitoring data including the battery information. The requirements described herein may be referred to as instructions.

The main microcomputer 45 receives the monitoring data including the battery information transmitted from the wireless IC 44, and executes a predetermined process based on the monitoring data. For example, the main microcomputer 45 executes a process of transmitting the acquired battery information to the ECU 14. The main microcomputer 45 may calculate SOC and/or SOH based on the battery information, and may transmit the calculated battery information including the SOC and/or SOH to the ECU 14. The main microcomputer 45 may execute an equalization process for equalizing the voltage of each of the battery cells 22 based on the battery information. The main microcomputer 45 may acquire an ignition (IG) signal of the vehicle 10 and execute the above-described processes according to the driving state of the vehicle 10. The main microcomputer 45 may execute a process of detecting an abnormality in the battery cell 22 based on the battery information, or may transmit an abnormality detection information to the ECU 14.

The sub microcomputer 46 is a microcomputer provided including a CPU, a ROM, a RAM, an input/output interface, a bus connecting these elements, and the like. The ROM stores various programs executed by the CPU. The sub microcomputer 46 executes the monitoring process in the control device 40. For example, the sub microcomputer 46 may monitor data between the wireless IC 44 and the main microcomputer 45. The sub microcomputer 46 may monitor the state of the main microcomputer 45. The sub microcomputer 46 may monitor the state of the wireless IC 44.

<Wireless Communication>

Figure 5:
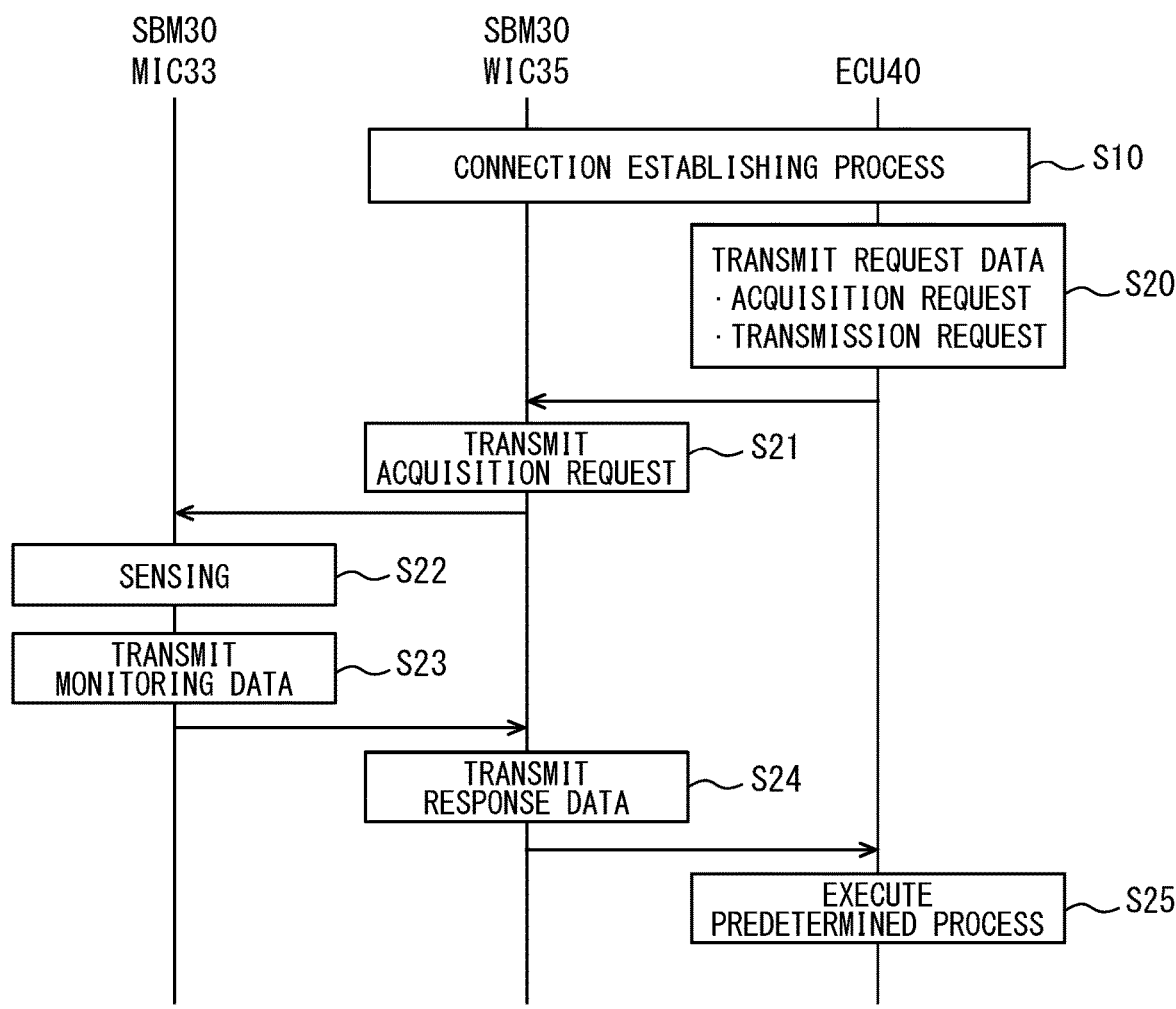
FIG. 5 is a diagram showing an example of a communication sequence between a monitoring device and a control device.
Figure 6:
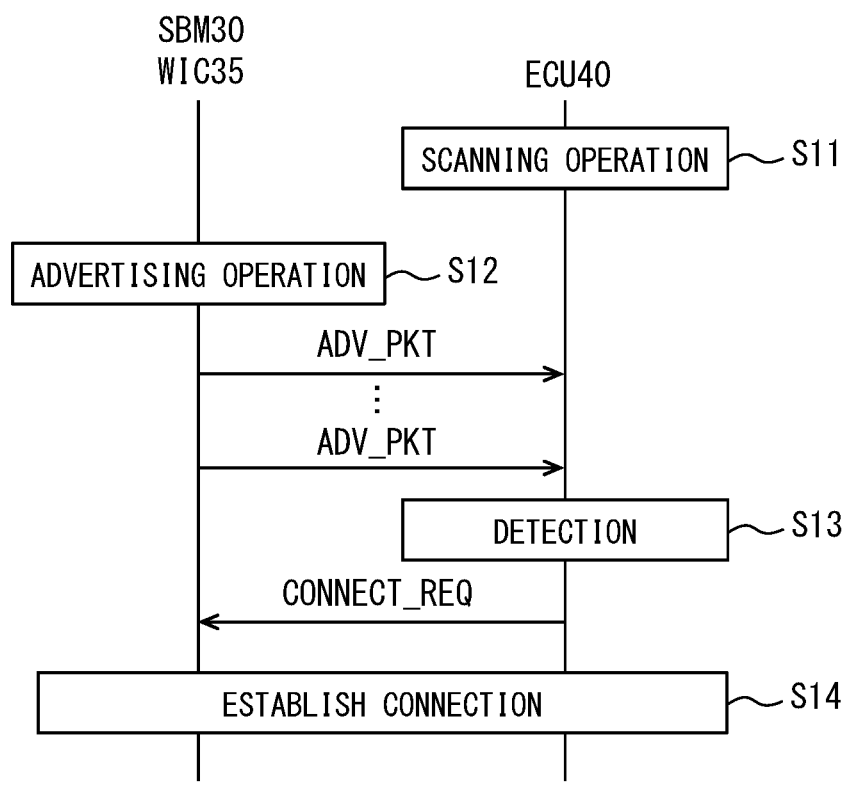
FIG. 6 is a diagram showing a connection establishing process.

Next, wireless communication between the monitoring devices 30 and the control device 40 will be described with reference to FIGS. 5 and 6. FIG. 5 is a diagram showing an example of a communication sequence between one of the monitoring devices 30 and the control device 40. In FIG. 5, the monitoring IC 33 is shown as an MIC 33, the wireless IC 35 is shown as a WIC 35, and the control device 40 is shown as an ECU 40. FIG. 6 is a diagram showing an example of a connection establishing process shown in FIG. 5.

As shown in FIG. 5, the wireless IC 35 of the monitoring device 30 and the control device 40 execute a process for establishing connection (S10).

Specifically, as shown in FIG. 6, the control device 40 executes a scanning operation (S11), and the wireless IC 35 executes an advertising operation (S12). The start of the scanning operation may be earlier than the start of the advertising operation, or may be at approximately the same timing. The start of the scanning operation may be later than the start of the advertising operation.

The wireless IC 35 executes the advertising operation in order to notify the control device 40 of the presence of the wireless IC 35, and transmits an advertisement packet (ADV_PKT) to the wireless IC 44 of the control device 40. The advertisement packet includes ID information of the monitoring device 30 and the control device 40.

When the control device 40 detects the advertisement packet, that is, the wireless IC 35 by the scanning operation, the control device 40 transmits a connection request (CONNECT_RQ) to the detected wireless IC 35 (S13).

Then, when the wireless IC 35 receives the connection request, connection is established between the one monitoring devices 30 and the control device 40 (S14). When the connection is established, the wireless IC 35 of the monitoring device 30 stops transmitting the advertisement packet. The wireless IC 35 periodically transmits the advertisement packet until the connection is established.

The monitoring devices 30 and the control device 40 execute the connection establishing process, for example, at a time of startup. The time of startup is, for example, a time when an operation power is supplied. In a configuration in which power is constantly supplied from the battery stack 21 and the battery 15, the monitoring devices 30 and the control device 40 are started up after a manufacturing process of the vehicle 10 or the replacement of parts at a repair shop. The time of startup may be a time at which a startup signal such as an IG signal is supplied. For example, when the IG signal is switched from off to on by operation by a user, the monitoring devices 30 and the control device 40 are started up. At the time of startup, the connection establishing process is executed between the control device 40 and all the monitoring devices 30 to which the wireless communication with the control device 40 is connected.

When the connection state is disconnected, the monitoring device 30 and the control device 40 execute the connection establishing process (S10) again. That is, the monitoring device 30 and the control device 40 execute reconnection. The control device 40 executes reconnection (connection establishment) with the disconnected monitoring device 30 while continuing data communication with the remaining monitoring devices 30 for which connection has been established. For example, disconnection occurs due to deterioration of the communication environment.

When the connection is established, the control device 40 periodically performs data communication with the monitoring device 30. As shown in FIG. 5, the control device 40 transmits the transmission data including the acquisition request and the transmission request of the monitoring data including the battery information, that is, the request data to the monitoring device 30 for which the connection has been established (S20).

Upon receiving the request data, the wireless IC 35 of the monitoring device 30 transmits an acquisition request of the monitoring data including battery information to the monitoring IC 33 (S21). In the present embodiment, the wireless IC 35 transmits the acquisition request to the monitoring IC 33 via the microcomputer 34.

Upon receiving the acquisition request, the monitoring IC 33 executes sensing (S22). The monitoring IC 33 executes sensing and acquires the battery information of each of the battery cells 22 through the multiplexer 32. Further, the monitoring IC 33 executes the failure diagnosis of the circuit.

Next, the monitoring IC 33 transmits the monitoring data including the battery information to the wireless IC 35

(S23). In the present embodiment, the monitoring data including the failure diagnosis result as well as the battery information is transmitted. The monitoring IC 33 transmits the monitoring data to the wireless IC 35 via the microcomputer 34.

Upon receiving the monitoring data acquired by the monitoring IC 33, the wireless IC 35 transmits transmission data including the monitoring data, that is, response data to the control device 40 (S24). The control device 40 receives the response data. The control device 40 periodically performs the above-described data communication with the monitoring device 30 for which the connection has been established.

The control device 40 executes a predetermined process based on the received response data, that is, the monitoring data (S25).

<Cycle Setting Process>

Figure 7:
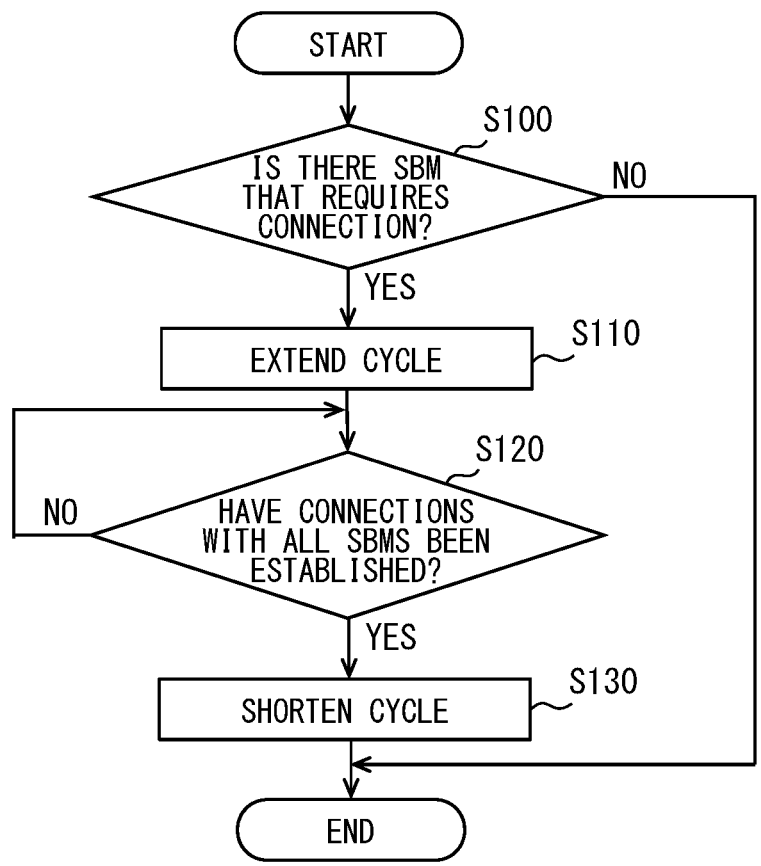
FIG. 7 is a flowchart showing an example of a cycle setting process executed by the control device.
Figure 8:
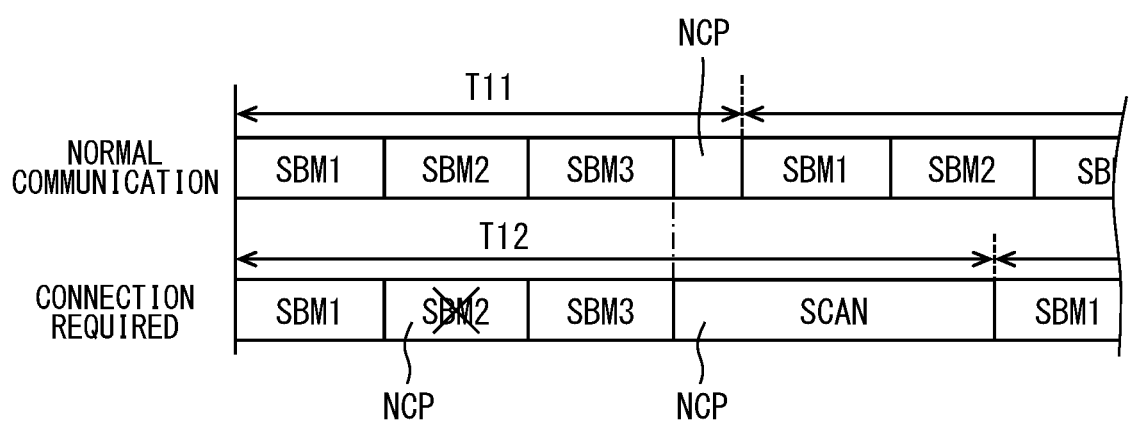
FIG. 8 is a timing chart showing an example of a cycle.

Next, the cycle setting process will be described with reference to FIGS. 7, 8 and 9. FIG. 7 is a flowchart showing an example of the cycle setting process executed by the control device 40. FIG. 8 is a timing chart showing an example of the cycle. FIG. 8 shows an example in which the control device 40 performs wireless communication with three monitoring devices 30, specifically, an SBM1, an SBM2, and an SBM3. For example, SBM1 shown in FIG. 8 indicates a period during which the control device 40 performs data communication with the SBM1.

In normal communication shown in FIG. 8, the control device 40 establishes connections with the three monitoring devices 30. The control device 40 performs data communication with each of the monitoring devices 30. When connection is required, the control device 40 performs data communication with a part of the monitoring devices 30 and performs the connection establishing process with the remaining monitoring devices 30. FIG. 8 shows an example in which the connection with the SBM2 is not established and the connection establishing process is performed with the SBM2. FIG. 9 is a timing chart showing an example of cycle switching.

When the control device 40 establishes a connection with one or more of the monitoring devices 30, the control device 40 executes wireless communication at a predetermined cycle. The control device 40 sets the cycle so that the multiple monitoring devices 30 to be connected make a round. The control device 40 executes the cycle setting process shown in FIG. 7 to adjust the cycle. The control device 40 may repeatedly execute the cycle setting process, or may execute the cycle setting process with satisfaction of a predetermined condition as a trigger. For example, the cycle setting process may be executed with the failure to acquire the battery information as a trigger.

First, the control device 40 determines whether or not there is a monitoring device (SBM) 30 that requires connection (S100). When data communication is performed with all the monitoring devices 30, the control device 40 determines that there is no monitoring device 30 that requires connection, and ends a series of processes.

The control device 40 determines that there is a monitoring device 30 that requires reconnection when, for example, communication with a part of the monitoring devices 30 is disconnected. The control device 40 may determine whether or not there is a monitoring device 30 that requires reconnection, for example, based on the acquired monitoring data. Specifically, when battery information such as cell voltage cannot be acquired a predetermined number of times or for a predetermined period of time, the control device 40 determines that a monitoring device 30 requires reconnection. The control device 40 may determine whether or not there is a monitoring device 30 that requires reconnection based on communication record information such as the number of communication errors, the number of data retransmission occurrences, and a received signal strength (RSSI). The control device 40 may use the communication record information acquired by the control device 40, or may use the communication record information included in the response data acquired from the monitoring device 30. RSSI is an abbreviation for Received Signal Strength Indicator.

For example, at the time of startup, the control device 40 determines that there is a monitoring device 30 that requires connection when executing the connection establishing process with one of the monitoring devices 30 while performing data communication with others of the monitoring devices 30 for which connections have been established. Here, since a connection with the SBM2 is required, the control device 40 determines that there is a monitoring device 30 that requires connection.

When determining in S100 that there is a monitoring device 30 that requires connection, the control device 40 executes a cycle extension process (S110). When connection is required, the control device 40 extends the cycle as compared with the cycle in the normal communication.

As shown in FIG. 8, the control device 40 wirelessly communicates with the monitoring devices 30 in a cycle T11 in the normal communication. The cycle T11 has a data communication period with the monitoring devices (SBM1, SBM2, SBM3) 30 and a margin period. The margin period may be referred to as a free period or a spare period. In the normal communication, the margin period is the non-communication period NCP in which periodic data communication with the monitoring devices 30 is not performed. The data communication period is a period obtained by totalizing periods allocated for data communication with each of the monitoring devices 30. The periods allocated for data communication with the respective monitoring device 30 are equal to each other. In the present embodiment, the margin period is shorter than the periods allocated for data communication with the respective monitoring device 30. The periods of data communication with the respective monitoring device 30 are continuously set. In the example shown in FIG. 8, the periods of data communication with the SBM1, the SBM2, and the SBM3 are continuously set in this order. The margin period is set last in the cycle T11. The period may be referred to as a section or time. The control device 40 performs data communication in the order of the SBM1, the SBM2, and the SBM3 in the cycle T11.

By executing the process of S110, the control device 40 extends the cycle as compared with the cycle in the normal communication. As shown in FIG. 8, the control device 40 wirelessly communicates with the monitoring devices 30 in a cycle T12 when connection is required. In the cycle T12, the periods allocated for data communication with the respective monitoring device 30 are equal to the periods in the cycle T11. In the present embodiment, even if the cycle is changed, the periods allocated for data communication with the respective monitoring devices 30 are constant. The control device 40 performs data communication with the SBM1 and the SBM3 as in the normal communication.

The cycle T12 is longer than the cycle T11. As a result, the margin period when connection is required is longer than the margin period in the normal communication. The margin period is longer than the period allocated for data communication with each of the monitoring devices 30. Further, since the connection with the SBM2 is disconnected, the period allocated for data communication with the SBM2 is also the period during which the data communication is not performed. That is, the non-communication period NCP when connection is required includes the margin period that is longer than the margin period in the normal communication and the period allocated for data communication with the SBM2. The non-communication period NCP is longer than the non-communication period NCP in the normal communication.

As shown in FIG. 8, the control device 40 executes the above-described scanning operation (S11) in order to establish the connection with the SBM2 during the margin period of the non-communication period NCP of the cycle T12. Similarly, the SBM2 executes the advertising operation (S12) during the non-communication period NCR In this way, the control device 40 establishes the connection with the SBM2 while maintaining data communication with the SBM1 and the SBM3.

Next, the control device 40 determines whether or not connections have been established with all the monitoring devices 30 to be communicated (S120). The control device 40 executes the process of S120 until the connections with all the monitoring devices 30 are established.

When it is determined that the connections with all the monitoring devices 30 have been established, the control device 40 then executes the cycle shortening process (S130), and ends the series of processes. The control device 40 shortens the cycle as compared with the cycle when connection is required. The control device 40 executes the cycle shortening process and sets a cycle T13 shown in FIG. 9. The control device 40 may set, for example, the same value (time) as the cycle T11 set before executing the cycle extension process in S110 as the cycle T13 after shortening. The control device 40 may set a value (time) different from the cycle T11 set before executing the cycle extension process in S110 as a new cycle in the normal communication. That is, the cycle in the normal communication may be updated. The non-communication period NCP (margin period) of the cycle T13 is shorter than the margin period of the cycle T12.

Figure 9:
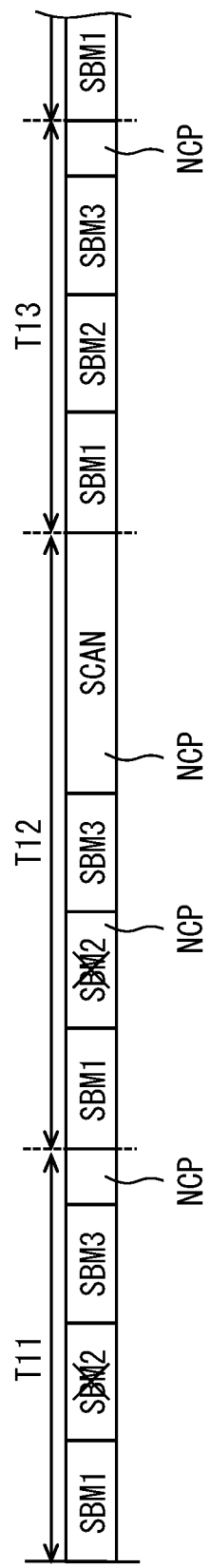
FIG. 9 is a timing chart showing an example of cycle switching.

FIG. 9 shows an example in which a reconnection is performed after the connection with the SBM2 is disconnected. In the cycle T11 shown in FIG. 9, the connection with the SBM2 is disconnected. Accordingly, a connection establishment with the SBM2 is required, and the control device 40 extends the cycle. By setting the period T12, the non-communication period NCP, particularly the margin period, is extended. During the margin period of the non-communication period NCP, the control device 40 executes the connection establishing process (S10) including the scanning operation with the SBM2. When the SBM2 is reconnected by the connection establishing process, the control device 40 shortens the cycle. The control device 40 performs data communication with each of the SBM1, the SBM2, and the SBM3 in the cycle T13.

Although only one cycle T12 is shown in FIG. 9, the control device 40 repeatedly executes the cycle T12 until the connection with the SBM2 is established.

FIG. 9 shows an example in which the connection establishing process is executed in the cycle following the cycle in which the connection is disconnected, but the present disclosure is not limited to this example. A cycle may be provided between the cycle in which the connection is disconnected and the cycle in which the connection establishing process is executed to transmit cycle change information to the SBM1 and the SBM3 with which the connection has been established. For example, cycle information may be included in the data transmitted to the SBM1 and the SBM3 while keeping the cycle T11. The cycle information may be, for example, a cycle change instruction or a cycle to be changed.

FIG. 9 shows an example in which the cycle is shortened in the cycle following the cycle in which the connection is established, but the present disclosure is not limited to this example. A cycle may be provided between the cycle in which the connection is established and the shortened cycle to transmit the cycle change information to the SBM1, the SBM2, and the SBM3 with which the connection has been established. For example, cycle information may be included in the data transmitted to the SBM1, the SBM2 and the SBM3 while keeping the cycle T12. The configuration may be modified such that the control device 40 manages the cycles and does not transmit the change information to the monitoring devices 30.

The control device 40 sets the cycles as described above. The control device 40 manages wireless communication at the cycle that is set. The cycles may be stored in a memory, for example, or may be calculated by an operation using a function.

Summary of First Embodiment

In a case where the cycle of wireless communication cannot be adjusted, that is, in a case where the cycle is constant (fixed), if a disconnection occurs due to, for example, deterioration of the communication environment, there is a possibility that a reconnection takes time and the monitoring data including the battery information cannot be acquired for a long period of time. For example, it takes time to establish connection at startup, and there is a possibility that the start of acquiring the battery information is delayed. For example, when data communication is performed at a regular cycle when the battery state does not fluctuate significantly, power consumption may become an issue.

On the other hand, in the present embodiment, the control device 40 sets the cycle of wireless communication with the multiple monitoring devices 30. The control device is capable of adjusting the cycle. As a result, the battery management system can have a high degree of freedom in communication. That is, it is possible to prevent the above-described issues from occurring in the vehicle 10.

In the present embodiment, when the predetermined condition is satisfied, the control device 40 extends the cycle as compared with the case where the condition is not satisfied, thereby extending the non-communication period NCP as compared with the case where the condition is not satisfied. Accordingly, the cycle can be extended without reducing the communication amount for one monitoring device 30 at one time. Specifically, when the control device 40 performs data communication with a part of the monitoring devices 30 and performs the scanning operation in order to connect with another part of the monitoring devices 30, the control device 40 extends the non-communication period NCP as compared with the non-communication period in the normal communication in which data communication is performed with all of the monitoring devices 30. In this way, when connection is required, the time that can be used for the connection establishing process such as the scanning operation becomes longer in one cycle. For example, the time that can be used for the connection establishing process becomes longer than when the margin period is used for the connection establishing process while maintaining the cycle T11 shown in FIG. 8. Therefore, it is possible to shorten the time required for reconnection when disconnection occurs due to deterioration of the communication environment. In addition, the time required to establish connection at startup can be shortened. As a result, it is possible to suppress a lack of the monitoring data transmitted from the specific monitoring device 30.

In a case of wireless communication, the communication speed is slower than that of wired communication, and the communication frequency is often low. Therefore, in a case where an abnormality occurs in at least one of physical quantities such as a voltage, or in a case where an abnormality is detected by failure diagnosis information, when a lack of the monitoring data occurs, a value may be changed suddenly. If the value is changed suddenly, the control will be changed suddenly, and although there is no problem in safety, there is a risk that operability will be affected. According to the present embodiment, it is possible to suppress the lack of monitoring data indicating an abnormality. Accordingly, the influence on the operability can be suppressed.

Further, by suppressing the lack of the monitoring data, it is possible to accurately estimate an element estimated by the accumulation of the monitoring data, for example, the accumulation of a battery damage. In addition, the detection of abnormalities may be performed using the number of times exceeding the threshold value. Also in the present case, by suppressing the lack of the monitoring data, it is possible to accelerate the detection timing of abnormalities.

Although an example has been described in which the control device 40 executes the scanning operation only in the margin period of the non-communication period NCP when connection is required, the present disclosure is not limited to this example. The control device 40 may execute the scanning operation, for example, during the entire non-communication period NCR That is, the scanning operation may be executed both in the margin period and the period allocated for communication with the disconnected monitoring device 30. According to this example, the connection establishment can be accelerated. Further, when the period allocated for communication with one monitoring device 30 is longer than the margin period in the normal communication, the control device 40 may execute the scanning operation only in the period allocated for communication with the disconnected monitoring device 30 in the non-communication period NCR Second Embodiment The second embodiment is a modification of the preceding embodiment as a basic configuration and may incorporate description of the preceding embodiment. In the preceding embodiment, the cycle in the normal communication includes the margin period. Instead of the above example, the cycle in the normal communication may be set not to include the margin period.

Figure 10:
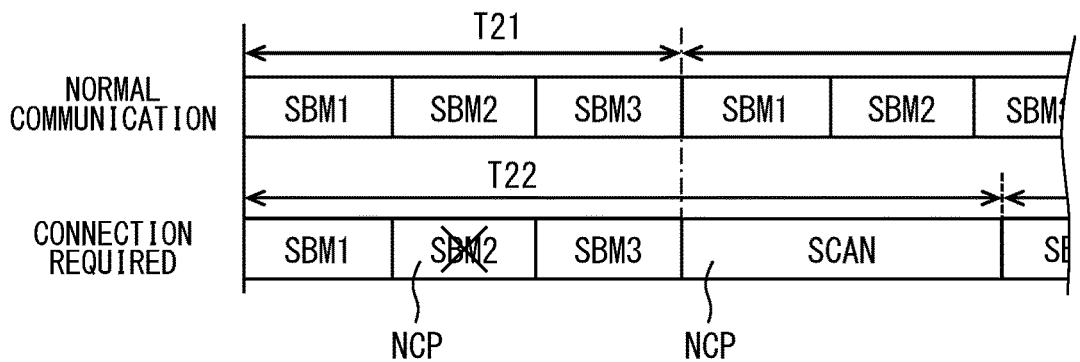
FIG. 10 is a timing chart showing an example of a cycle set by a control device according to a second embodiment.

The control device 40 of the present embodiment executes the cycle setting process (see FIG. 7) as the control device 40 described in the preceding embodiment. FIG. 10 is a timing chart showing an example of the cycle in the present embodiment. FIG. 10 shows an example in which the control device 40 performs wireless communication with three monitoring devices 30, specifically, the SBM1, the SBM2, and the SBM3. In this example, connection is required when communication with the SBM2 is disconnected.

As shown in FIG. 10, a cycle T21 set by the control device 40 in the normal communication does not include the margin period like the cycle T11 shown in the preceding embodiment. The cycle T21 includes only the data communication period.

On the other hand, a cycle T22 set by the control device 40 when connection is required includes the margin period at the end of the cycle T22. The period T22 includes the data communication period and the non-communication period NCP including the margin period. Also in the example shown in FIG. 10, the non-communication period NCP includes the period allocated for data communication with the SBM2. As described above, the control device 40 does not set the margin period in the normal communication as the cycle, but sets the margin period when connection is required. The control device 40 performs the scanning operation to establish the connection with the SBM2 in at least a part of the non-communication period NCR The control device 40 executes the scanning operation during the margin period in the non-communication period NCP of the cycle T22.

Summary of Second Embodiment

According to the present embodiment, it is possible to achieve the same effect as the configuration described in the preceding embodiment.

In the above example, the control device 40 executes the scanning operation in the margin period. However, the present disclosure is not limited to the above example. The control device 40 may execute the scanning operation during the entire non-communication period NCP or only during the period allocated for data communication with the SBM2.

Third Embodiment

The third embodiment is a modification of the preceding embodiments as a basic configuration and may incorporate description of the preceding embodiments. In the preceding embodiments, the scanning time is extended by extending the cycle. Instead of the above example, the scanning time may be extended by shortening the data communication period.

Figure 11:
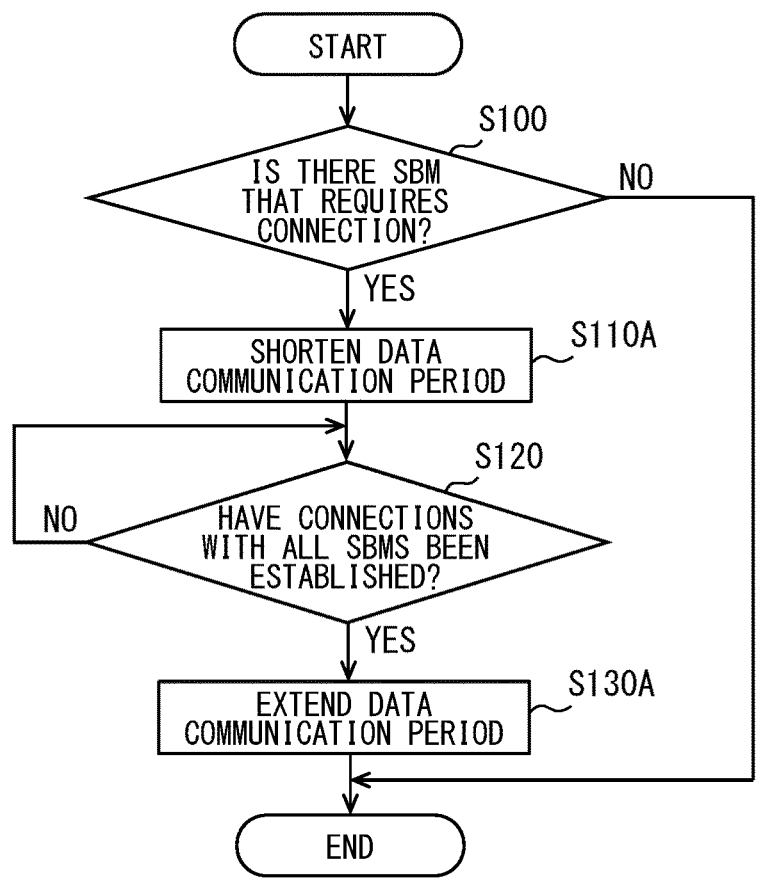
FIG. 11 is a flowchart showing an example of a cycle setting process executed by a control device according to a third embodiment.
Figure 12:
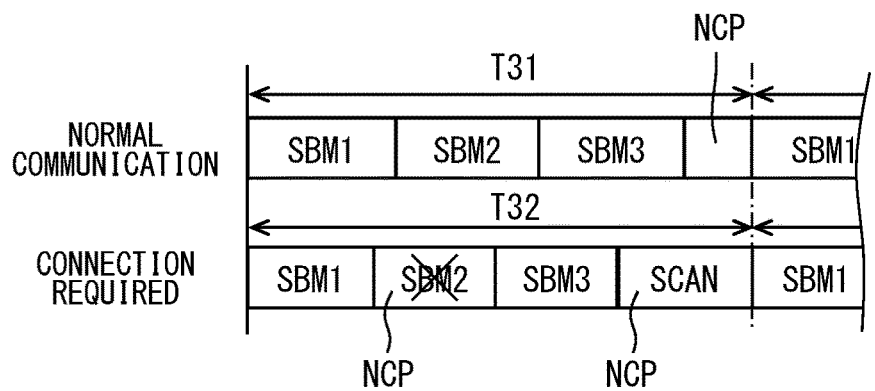
FIG. 12 is a timing chart showing an example of a cycle.

FIG. 11 is a flowchart showing an example of a cycle setting process executed by a control device 40 according to the present embodiment. FIG. 12 is a timing chart showing an example of the cycle. FIG. 12 shows an example in which the control device 40 performs wireless communication with three monitoring devices 30, specifically, the SBM1, the SBM2, and the SBM3. Also in this example, connection is required when communication with the SBM2 is disconnected.

As shown in FIG. 12, a cycle T31 set by the control device 40 in the normal communication includes the margin period. The cycle T31 is the same as the cycle T11 described above. In the normal communication, the control device 40 performs data communication with each of the monitoring devices 30.

As in the preceding embodiments, first, the control device 40 executes the process of S100. When data communication is performed with all the monitoring devices 30, the control device 40 determines that there is no monitoring device 30 that requires connection, and ends a series of processes.

When it is determined in S100 that there is a monitoring device 30 that requires connection, the control device 40 then executes a data communication period shortening process (S110A). When connection is required, the control device 40 shortens the data communication period as compared with the data communication period in the normal communication.

As shown in FIG. 12, when connection is required, the control device 40 sets a cycle T32 having the same length of time as the cycle T31. In the cycle T32, lengths of the data communication period and the non-communication period NCP are different from those in the normal communication. The control device 40 shortens the data communication period of the cycle T32 to be shorter than the data communication period of the cycle T31 in the normal communication. In the example shown in FIG. 12, each period allocated for data communication with each of the monitoring device 30 is made shorter than that in the normal communication. That is, not only the periods allocated for data communication with the SBM1 and the SBM3, but also the period allocated for data communication with the disconnected SBM2 is shortened. In addition, the margin period is made longer than the margin period in the normal communication by the amount that the data communication period is shortened.

When connection is required, the control device 40 executes the scanning operation to establish connection with the SBM2 during at least a part of the non-communication period NCR In the example shown in FIG. 12, the control device 40 executes the scanning operation during the margin period of the non-communication period NCR Similarly, the SBM2 executes the advertising operation during the non-communication period NCP (margin period). In this way, the control device 40 establishes the connection with the SBM2 while maintaining data communication with the SBM1 and the SBM3.

Next, the control device 40 executes the process of S120 as in the preceding embodiments. The control device 40 executes the process of S120 until the connections with all the monitoring devices 30 are established.

When determining that the connections with all the monitoring devices 30 have been established, the control device 40 then executes the data communication period extension process (S130A), and ends a series of processes. The control device 40 extends the data communication period as compared with the data communication period when connection is required. Here, the data communication period is extended while maintaining the same length of time as the cycle T31. The control device 40 may return the data communication period to the setting before executing the process of S110A, or may set the value different from the setting before executing the process of S110A.

Summary of Third Embodiment

According to the present embodiment, it is possible to achieve the same effect as the configuration described in the preceding embodiments.

Similarly to the preceding embodiments, when the predetermined condition is satisfied, the control device 40 extends the non-communication period in the cycle as compared with when the condition is not satisfied. When the condition is satisfied, the control device 40 shortens the data communication period in the cycle as compared with the case where the condition is not satisfied, and thereby extending the non-communication period NCP as compared with the case where the condition is not satisfied. As a result, the non-communication period NCP can be extended without changing the entire length of the cycle. Specifically, when connection is required, the non-communication period NCP is extended by shortening the data communication period as compared with the data communication period in the normal communication. Then, the control device 40 executes the connection establishing process such as the scanning operation during the non-communication period NCR In this way, when connection is required, the time that can be used for the connection establishing process such as the scanning operation becomes longer in one cycle. Therefore, it is possible to shorten the time required for reconnection when disconnection occurs due to deterioration of the communication environment. In addition, the time required to establish connection at startup can be shortened. As a result, it is possible to suppress a lack of the monitoring data. In the present embodiment, the time required for establishing connection can be shortened without changing the entire length of the cycle.

Figure 13:
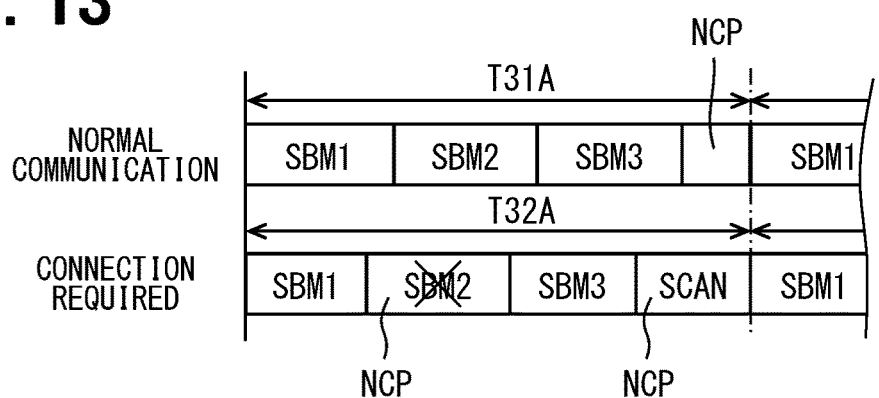
FIG. 13 is a timing chart showing a cycle according to a modification.

Although an example has been described in which the control device 40 executes the scanning operation only during the margin period of the non-communication period NCP when connection is required, the present disclosure is not limited to this example. The control device 40 may execute the scanning operation, for example, during the entire non-communication period NCR When the period allocated for communication with one monitoring device 30 is longer than the margin period in the normal communication, the control device 40 may execute the scanning operation only during the period allocated for communication with the disconnected monitoring device 30 in the non-communication period NCR Modifications FIG. 12 shows an example in which the period allocated for data communication with the disconnected monitoring device 30 is shortened as well as the period of the monitoring device 30 that maintains the data communication. However, as shown in FIG. 13, when connection is required, the control device 40 may also set a cycle T32A in which the period allocated to the disconnected monitoring device 30 is not shortened, and only the data communication period is shortened. A cycle T31A in the normal communication shown in FIG. 13 is the same as the cycle T31 described above. FIG. 13 shows an example in which the scanning operation is executed during the margin period, but as described above, the scanning operation may be executed during the entire non-communication period NCP, or only during the period allocated to the SBM2.

Figure 14:
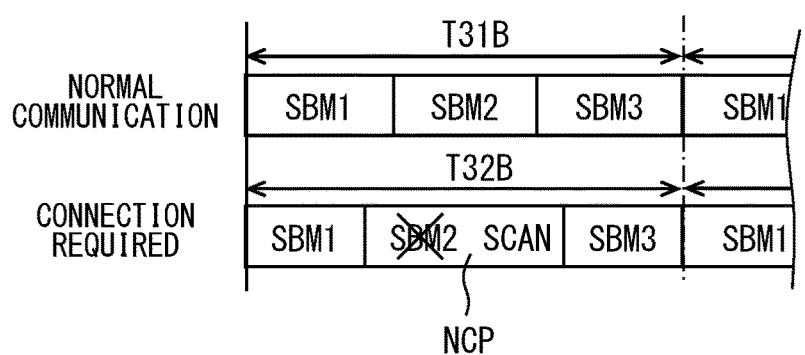
FIG. 14 is a timing chart showing a cycle according to another modification.

As shown in the second embodiment, the cycle in the normal communication may exclude the margin period. For example, in an example shown in FIG. 14, the control device 40 sets a cycle T31B that does not include a margin period in the normal communication. The cycle T31B is the same as the above-described cycle T21. The cycle T31B set in the normal communication does not include the non-communication period NCR When connection is required, the control device 40 sets a cycle T32B in which the period allocated to the disconnected monitoring device 30 is extended and the data communication period is shortened as compared in the normal communication. The control device 40 executes the scanning operation in the non-communication period NCP, which is the period allocated to the SBM2. Therefore, the time required for establishing connection can be shortened. Also in this case, the time required for establishing connection can be shortened without changing the entire length of the cycle.

The configuration described in the present embodiment can be combined with either the configuration described in the first embodiment or the configuration described in the second embodiment. When connection is required, the control device 40 may adjust the cycle so as to shorten the data communication time while extending the length (time) of the cycle. In this case, a longer scanning time can be secured.

Fourth Embodiment

The fourth embodiment is a modification of the preceding embodiments as a basic configuration and may incorporate description of the preceding embodiments. In the preceding embodiments, the cycle is uniformly extended when there is a monitoring device 30 that requires connection. Instead of this example, the extension amount of the cycle may be changed based on the possibility that the battery state fluctuate significantly.

Figure 15:
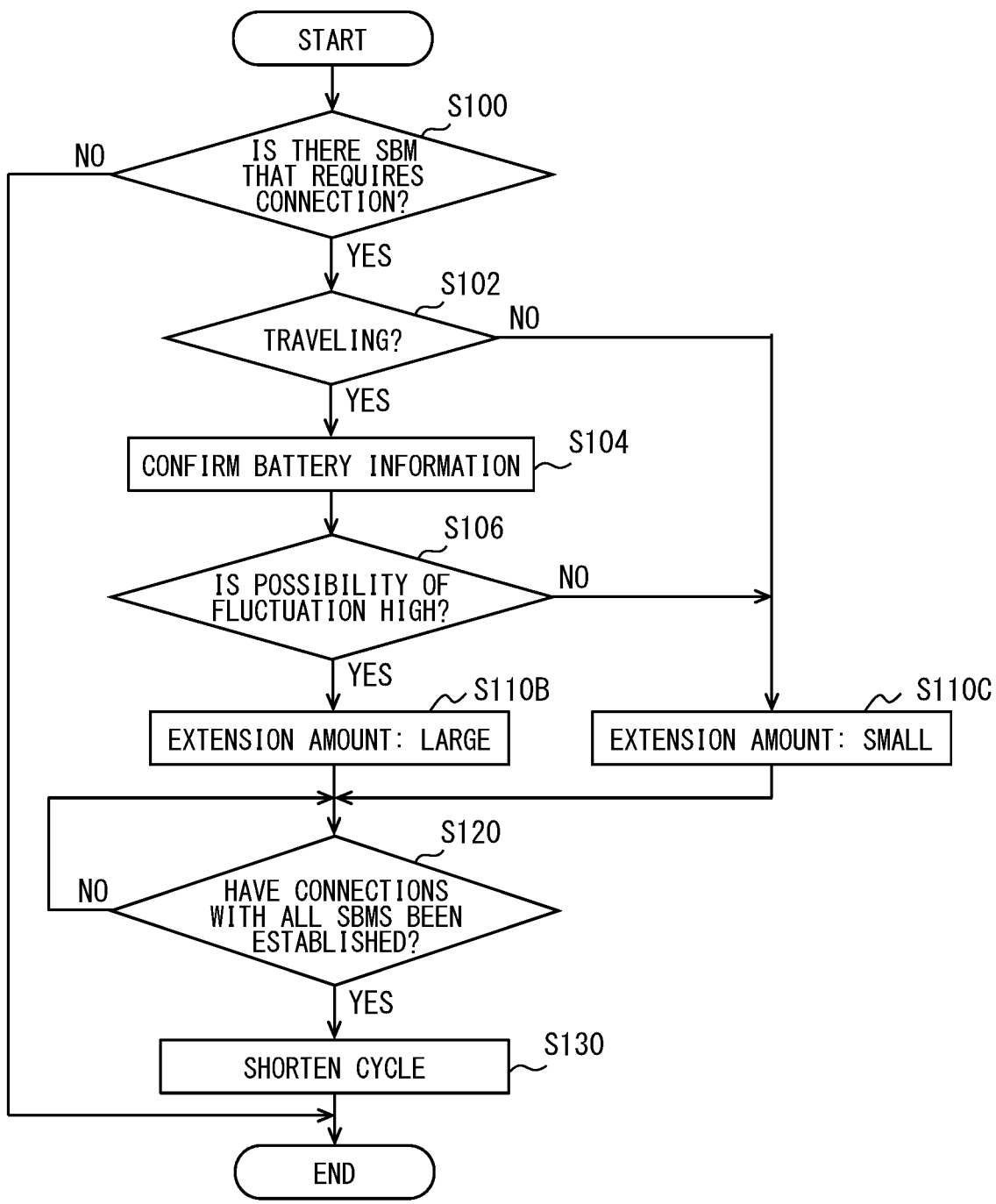
FIG. 15 is a flowchart showing an example of a cycle setting process executed by a control device according to a fourth embodiment.
Figure 16:
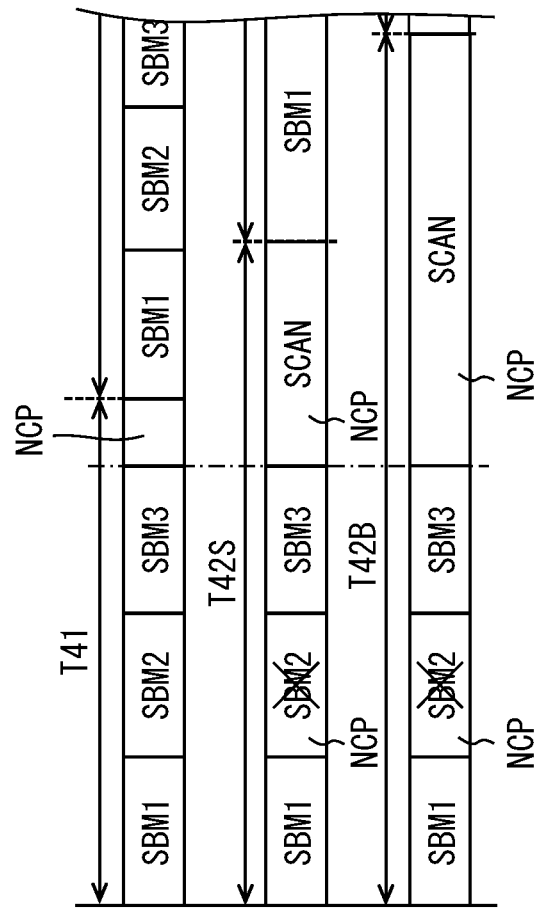
FIG. 16 is a timing chart showing an example of a cycle.

FIG. 15 is a flowchart showing an example of a cycle setting process executed by a control device 40 according to the present embodiment. FIG. 16 is a timing chart showing an example of the cycle. FIG. 16 corresponds to FIG. 8. FIG. 16 also shows an example in which the control device 40 performs wireless communication with the SBM1, the SBM2, and the SBM3. Also in this example, connection is required when communication with the SBM2 is disconnected.

As shown in FIG. 16, a cycle T41 set by the control device 40 in the normal communication includes the margin period. The cycle T41 is the same as the cycle T11 described above. In the normal communication, the control device 40 performs data communication with each of the monitoring devices 30.

As in the preceding embodiments, first, the control device 40 executes the process of S100. When data communication is performed with all the monitoring devices 30, the control device 40 determines that there is no monitoring device 30 that requires connection, and ends a series of processes.

When determining that there is a monitoring device 30 that requires connection, the control device 40 then determines whether or not the vehicle 10 is traveling (S102). The control device 40 may acquire a sensor signal mounted on the vehicle 10 such as a vehicle speed sensor and determine whether or not the vehicle is traveling. The control device 40 may determine whether or not the vehicle is traveling based on the on/off state of an IG switch or an SMR. The control device 40 may determine whether or not the vehicle is traveling based on a signal from another control device (ECU) mounted on the vehicle 10. SMR is an abbreviation for System Main Relay.

When determining that the vehicle is traveling, the control device 40 then confirms the acquired battery information (S104), and determines whether or not there is a high possibility that the battery state fluctuates significantly (S106).

The state of the battery fluctuates significantly depending on charging or discharging. As the battery information, the control device 40 uses the battery information acquired from the monitoring device 30 capable of maintaining data communication and/or the battery information acquired from the monitoring device 30 requiring reconnection before disconnection. Specifically, the control device 40 uses cell voltage information and/or current information. The control device 40 can determine whether or not there is a high possibility that the battery state fluctuates significantly based on the cell voltage information. When the cell voltage exceeds a first threshold value, or when the cell voltage shows the maximum voltage Vmax in a predetermined period, there is a high possibility that the battery discharges. Further, when the cell voltage is lower than a second threshold value lower than the first threshold value, or when the cell voltage shows the minimum voltage Vmin in the predetermined period, there is a high possibility that the battery charges. Further, even when the current value exceeds a predetermined threshold value, the possibility that the battery state fluctuates significantly is higher than when the current value is less than the predetermined threshold value.

As described above, the control device 40 determines whether or not there is a high possibility that the battery state fluctuate significantly based on the acquired battery information.

When determining that there is a high possibility that the battery state fluctuates significantly, the control device 40 executes a first extension process for extending the cycle (S110B). In the first extension process, the control device 40 extends the cycle as compared with the cycle in the normal communication, and sets a cycle T42B so that the extension amount becomes larger than a cycle T42S described later. That is, the control device 40 sets the cycle with the large extension amount. As shown in FIG. 16, in the cycle T42B, the period allocated for data communication with each of the monitoring devices 30 is equal to the cycle T41. Due to the extension of the cycle, the non-communication period NCP, especially the margin period, becomes longer. During the margin period of the non-communication period NCP, the control device 40 executes the connection establishing process including the scanning operation with the SBM2.

On the other hand, when determining that there is a low possibility that the battery state fluctuates significantly, the control device 40 executes a second extension process for extending the cycle (S110C). In the second extension process, the control device 40 extends the cycle as compared with the cycle in the normal communication, and sets the cycle T42S so that the extension amount becomes smaller than the cycle T42B. That is, the control device 40 sets the cycle with the small extension amount. As shown in FIG. 16, in the cycle T42B, the period allocated for data communication with each of the monitoring devices 30 is equal to the cycle T41. Due to the extension of the cycle, the non-communication period NCP, especially the margin period, becomes longer. However, the extension amount is smaller than the extension amount of the cycle T42B. During the margin period of the non-communication period NCP, the control device 40 executes the connection establishing process including the scanning operation with the SBM2.

Even when determining in S102 that the vehicle is non-traveling, the control device 40 executes the process of S110C. Since the battery state does not fluctuate significantly during non-traveling, the control device 40 executes the process of S110C. As described above, the control device 40 sets the cycle when connection is required.

When the processing of S110B or S110C is completed, the control device 40 then executes the process of S120 and subsequent processes. Since the processes after S120 are the same as those in the example shown in FIG. 8, the description thereof will be omitted.

Summary of Fourth Embodiment

According to the present embodiment, it is possible to achieve the same effect as the configuration described in the preceding embodiments.

In the present embodiment, the control device 40 makes the non-communication period NCP in the cycle longer when there is a high possibility that the battery state fluctuates significantly than when there is a low possibility that the battery state fluctuates significantly. Accordingly, it is possible to secure a longer scanning time and accelerate the connection when there is a high possibility that the battery state fluctuates significantly. For example, when the battery state fluctuates significantly, it is possible to suppress the lack of the monitoring data including battery information.

In the example shown in FIG. 15, when connection is required, the cycle extension amount is increased when the vehicle is traveling and there is a high possibility that the battery state fluctuates significantly, and the cycle extension amount is decreased when the vehicle is non-traveling or when there is a low possibility that the battery state fluctuates significantly. However, the present disclosure is not limited to this example.

For example, the process of S102 may be omitted. That is, the control device 40 may increase the cycle extension amount when there is a high possibility that the battery state fluctuates significantly, and may decrease the cycle extension amount when there is a low possibility that the battery state fluctuates significantly. Further, the processes of S104 and S106 may be omitted. That is, the control device 40 may increase the cycle extension amount during traveling and decrease the cycle extension amount during non-traveling. In either case, a longer scanning time can be ensured and the connection can be accelerated when the possibility that the battery status fluctuates significantly is high.

The configuration described in the present embodiment can be combined with any of the configuration described in the first embodiment, the configuration described in the second embodiment, and the configuration described in the third embodiment. For example, instead of providing a difference in the cycle extension amount, a difference may be provided in the shortening amount of the data communication period. That is, when there is a low possibility that the battery state fluctuates significantly, the shortening amount of the data communication period when connection is required is reduced. On the other hand, when there is a high possibility that the battery state fluctuates significantly, the shortening amount of the data communication period is increased as compared with the case where there is a low possibility. As a result, the non-communication period NCP can be extended when there is a high possibility that the battery state fluctuates significantly.

Fifth Embodiment

The fifth embodiment is a modification of the preceding embodiments as a basic configuration and may incorporate description of the preceding embodiments. In the preceding embodiments, the non-communication period is extended in order to accelerate the establishment of connection. Alternatively, the non-communication period may be extended in order to reduce power consumption.

Figure 17:
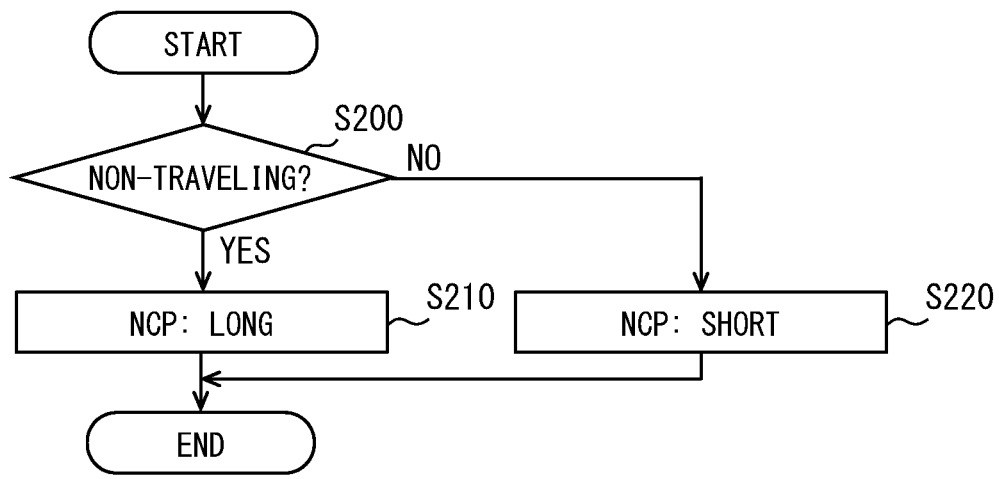
FIG. 17 is a flowchart showing an example of a cycle setting process executed by a control device according to a fifth embodiment.
Figure 18:
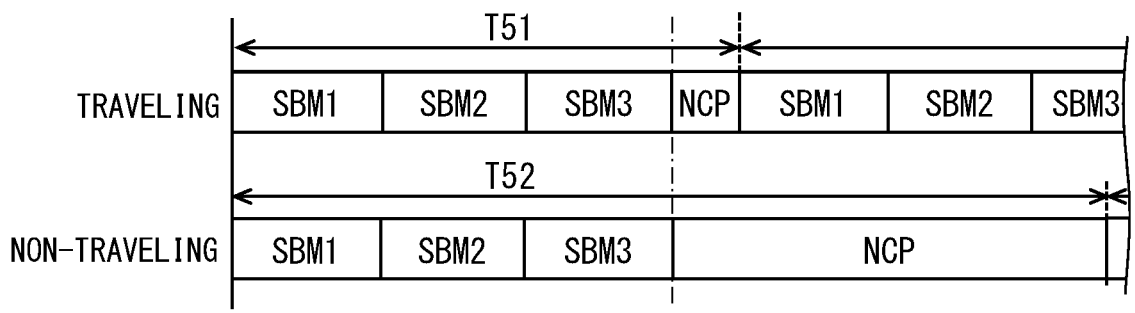
FIG. 18 is a timing chart showing an example of a cycle.

FIG. 17 is a flowchart showing an example of a cycle setting process executed by a control device 40 according to the present embodiment. FIG. 18 is a timing chart showing an example of the cycle. FIG. 18 also shows an example in which the control device 40 performs wireless communication with the SBM1, the SBM2, and the SBM3.

The control device 40 repeatedly executes the cycle setting process at a predetermined cycle. As shown in FIG. 17, first, the control device 40 determines whether or not the vehicle 10 is non-traveling (S200). As described in the fourth embodiment, the control device 40 determines whether or not the vehicle is non-traveling based on, for example, the sensor signal such as the vehicle speed sensor, the on/off state of the IG switch or the SMR, and the like.

When determining that the vehicle is non-traveling, the control device 40 sets the cycle so as to extend the non-communication period of the cycle (S210). On the other hand, when determining that the vehicle is not non-traveling, that is, the vehicle is traveling, the control device 40 sets the cycle so as to shorten the non-communication period of the cycle as compared with the non-communication period set in S210 (S220). When the process of S210 or S220 is completed, the control device 40 ends a series of processes.

As shown in FIG. 18, during traveling, the control device 40 sets a cycle T51 in which the non-communication period NCP is short. During non-traveling, the control device 40 sets a cycle T52 in which the non-communication period NCP is longer than during traveling. In the example shown in FIG. 18, the non-communication period NCP is a margin period provided at the end of the cycle in both traveling and non-traveling. The data communication periods with the monitoring devices 30 are equal to each other during traveling and during non-traveling. During non-traveling, the control device 40 sets the cycle T52 that is longer than the cycle T51 set during traveling.

Summary of Fifth Embodiment

According to the present embodiment, when the control device 40 sets the cycle T52 during non-traveling, the non-communication period NCP becomes longer than during traveling. The non-communication period NCP is a communication pause period during which data communication is not performed between the control device 40 and the monitoring devices 30. As a result, communication opportunities between the control device 40 and the monitoring devices 30 are reduced. Therefore, it is possible to reduce the power consumption by the battery management system 60 while monitoring the battery information even during non-traveling. Since the monitoring is not stopped during non-traveling, an abnormality in the battery cell 22 can be detected.

Figure 19:
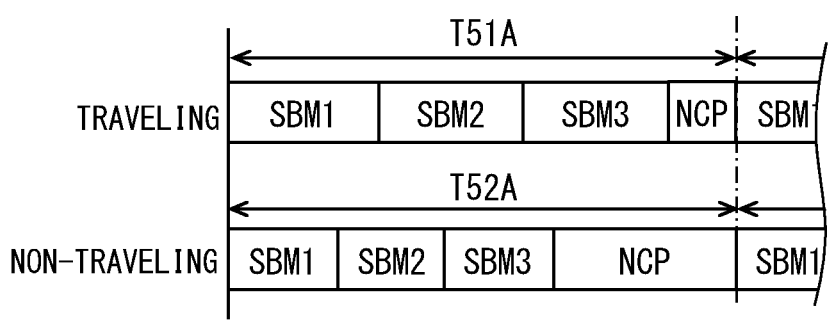
FIG. 19 is a timing chart showing a cycle according to a modification.

When an abnormality is detected during non-traveling, the control device 40 may switch the cycle to the cycle T51 in which the non-communication period NCP is short so as to increase the communication opportunities with the monitoring devices 30. When the cycle T51 is set to a predetermined time and it is determined that there is no problem as a result of closely monitoring the state of the battery cell 22, the control device 40 may switch the cycle to the cycle T52 having a long non-communication period NCR Modifications An example of extending the non-communication period NCP during non-driving by extending the cycle has been described, but the present disclosure is not limited thereto. In an example shown in FIG. 19, a cycle T52A set during non-traveling has the same time as the cycle T51A set during traveling. The data communication period of the cycle T52A is shorter than the data communication period of the cycle T51A. As a result, the non-communication period NCP during non-traveling is longer than the non-communication period NCP during traveling. Even when such a cycle is set, the communication opportunity per unit time is reduced, so that the power consumption by the battery management system 60 can be reduced while monitoring the battery information during non-driving.

FIG. 17 shows the example in which a difference is provided in the non-communication period according to the traveling state of the vehicle 10. Instead of this, a difference may be provided in the non-communication period depending on the possibility that the battery state fluctuates significantly. When the vehicle 10 is traveling, the battery state may fluctuate significantly. On the other hand, when the vehicle 10 is non-traveling, such as when the vehicle is parked or stopped, there is almost no possibility that the battery state fluctuates significantly. The control device 40 may execute the same processes of S104 and S106 shown in FIG. 15 instead of the process of S200.

When there is a low possibility that the battery state fluctuates significantly, the control device 40 executes the process of S210 to set the cycle T52 in which the non-communication period NCP is long. When there is a high possibility that the battery state fluctuates significantly, the control device 40 executes the process of S220 to set the cycle T51 in which the non-communication period NCP is short. Accordingly, when the battery state does not fluctuate significantly, it is possible to reduce the power consumption of the battery management system 60 while monitoring the battery information.

Sixth Embodiment

The sixth embodiment is a modification of the preceding embodiments as a basic configuration and may incorporate description of the preceding embodiments. In the preceding embodiments, it is determined whether or not there is a monitoring device that requires connection, and if connection is required, the non-communication period is extended. Alternatively, the non-communication period may be extended when the number of acquisitions of data for calculating at least one of an internal resistance and an open circuit voltage of the battery does not reach a predetermined number of times in a predetermined period.

The control device 40 calculates at least one of the internal resistance and the open circuit voltage of the battery based on the acquired battery information. Calculating at least one of the internal resistance and the open circuit voltage includes a case of calculating only the internal resistance, a case of calculating only the open circuit voltage, and a case of calculating both of the internal resistance and the open circuit voltage. When the battery deteriorates, the internal resistance increases and the output voltage decreases. The control device 40 detects battery deterioration based on the calculated internal resistance. The open circuit voltage is the voltage in a state where the battery is not loaded. That is, the open circuit voltage is a voltage in a state where no current is flowing. The control device 40 detects a battery abnormality based on the calculated open circuit voltage. The control device 40 detects an abnormality when, for example, the difference between the open circuit voltages of adjacent battery cells 22 exceeds a predetermined value.

The control device 40 calculates at least one of the internal resistance and the open circuit voltage using the battery information obtained multiple times in a predetermined period (predetermined time). The control device 40 calculates at least one of the internal resistance and the open circuit voltage using, for example, the acquired cell voltage and the current value. The control device 40 calculates at least one of the internal resistance and the open circuit voltage using, for example, the least squares method. In order to calculate the internal resistance or the open circuit voltage by the least squares method, for example, it is necessary to acquire data several to several tens of times (predetermined number of times) in a time (predetermined period) of ten to several tens of cycles. The control device 40 calculates at least one of the internal resistance and the open circuit voltage for each of the battery cells 22.

Figure 20:
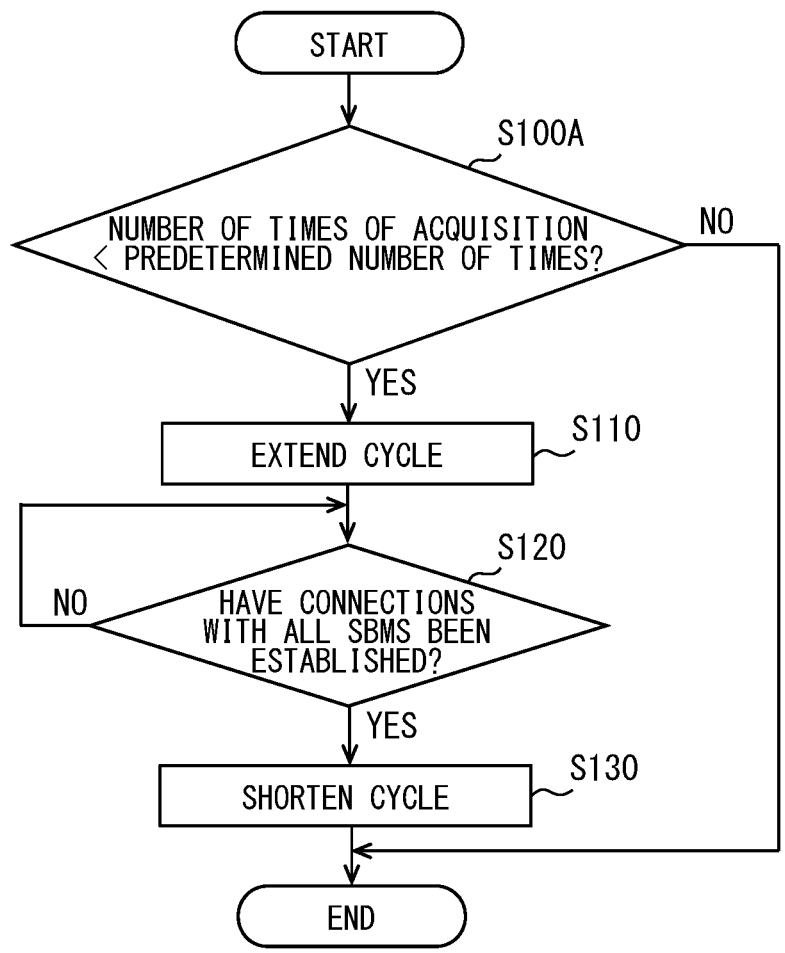
FIG. 20 is a flowchart showing an example of a cycle setting process executed by a control device according to a sixth embodiment.

FIG. 20 is a flowchart showing an example of a cycle setting process executed by the control device 40 according to the present embodiment. First, the control device 40 determines whether or not the number of times of acquiring the battery information in the predetermined period is less than a predetermined number of times (S100A). The control device 40 determines the number of times of acquiring the battery information for each of the monitoring devices 30. When determining that the number of times the battery information is acquired is not less than the predetermined number of times for all the monitoring devices 30, the control device 40 ends a series of processes.

When determining in S100A that there is a monitoring device 30 whose acquisition number is less than the predetermined number of times, the control device 40 executes the same process as the process shown in FIG. 7. Specifically, the control device 40 executes the cycle extension process. This process increases the non-communication period NCP, as described in the preceding embodiments. As in the preceding embodiments, the control device 40 executes the scanning operation for establishing connection in at least a part of the non-communication period NCR The control device 40 executes the scanning operation during the non-communication period NCP in order to reconnect to the monitoring device 30 whose acquisition number is less than the predetermined number of times.

For example, in a configuration including the SBM1, the SBM2, and the SBM3 as the monitoring devices 30, if the acquisition number of times of the SBM2 falls below the predetermined number of times, the control device 40 establishes a connection with the SBM2 while maintaining data communication with the SBM1 and the SBM3. The SBM2 corresponds to the first monitoring device among the multiple monitoring devices.

Next, the control device 40 executes the process of S120 as in the preceding embodiments. The control device 40 executes the process of S120 until the connections with all the monitoring devices 30 are established. When determining that the connections with all the monitoring devices 30 have been established, the control device 40 then executes the process of S130 to shorten the cycle and ends the series of processes.

Summary of Sixth Embodiment

According to the present embodiment, it is possible to achieve the same effect as the configurations described in the preceding embodiments.

In the present embodiment, when the data necessary for calculating at least one of the internal resistance and the open circuit voltage of the battery is insufficient, the non-communication period is extended to accelerate the timing of reconnection. Accordingly, it is possible to shorten the period during which the internal resistance or the open circuit voltage cannot be calculated. Therefore, it is possible to detect battery deterioration at an early stage. In addition, the accuracy of detecting battery deterioration can be improved. In addition, it becomes possible to detect a battery abnormality at an early stage.

In the embodiment, an example has been described in which the non-communication period NCP is extended by extending the cycle. That is, the combination with the configuration shown in the first embodiment has been described, but the present disclosure is not limited thereto. The configuration described in the present embodiment can also be combined with either the configuration described in the second embodiment or the configuration described in the fourth embodiment. For example, instead of extending the cycle, the data communication period may be shortened, thereby extending the non-communication period NCP and accelerating the reconnection.

Other Embodiments

The disclosure in this specification, the drawings, and the like is not limited to the exemplified embodiments. The disclosure encompasses the illustrated embodiments and variations thereof by those skilled in the art. For example, the disclosure is not limited to the parts and/or combinations of elements shown in the embodiments. The disclosure may be implemented in various combinations. The disclosure may have additional portions that may be added to the embodiments. The disclosure encompasses omission of components and/or elements of the embodiments. The disclosure encompasses the replacement or combination of components and/or elements between one embodiment and another. The disclosed technical scope is not limited to the description of the embodiments. It should be understood that some disclosed technical ranges are indicated by description of claims, and includes every modification within the equivalent meaning and the scope of description of claims.

The disclosure in the specification, the drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

When an element or a layer is described as "disposed above" or "connected", the element or the layer may be directly disposed above or connected to another element or another layer, or an intervening element or an intervening layer may be present therebetween. In contrast, when an element or a layer is described as "disposed directly above" or "directly connected", an intervening element or an intervening layer is not present. Other terms used to describe the relationships between elements (for example, "between" vs. "directly between", and "adjacent" vs. "directly adjacent") should be interpreted similarly. As used herein, the term "and/or" includes any combination and all combinations relating to one or more of the related listed items. For example, the term A and/or B includes only A, only B, or both A and B.

Spatial relative terms "inside", "outside", "back", "bottom", "low", "top", "high", etc. are used herein to facilitate the description that describes relationships between one element or feature and another element or feature. Spatial relative terms can be intended to include different orientations of a device in use or operation, in addition to the orientations depicted in the drawings. For example, when the device in the figure is flipped over, an element described as "below" or "directly below" another element or feature is directed "above" the other element or feature. Therefore, the term "below" can include both above and below. The device may be oriented in the other direction (rotated 90 degrees or in any other direction) and the spatially relative terms used herein are interpreted accordingly.

The device, the system and the method therefor which have been disclosed in the present disclosure may be realized by dedicated computers which constitute processors programmed for executing one or more functions concretized by computer programs. Also, the device and the method therefor which have been described in the present disclosure may be also realized by a special purpose hardware logic circuit. Furthermore, the device and the method described in the present disclosure may be implemented by one or more dedicated computers configured by a combination of a processor executing a computer program and one or more hardware logic circuits. The computer program may be stored, as instructions to be executed by a computer, in a tangible non-transitory computer-readable medium. Namely, the means and/or the functions which are provided by the processor and the like may be provided by software stored in tangible memory devices and computers for executing them, only software, only hardware, or a combination thereof. For example, some or all of the functions provided by the processor may be realized as hardware. A mode in which a certain function is realized as hardware includes a mode in which one or more ICs are used. The processor may be realized by using an MPU, a GPU, or a DFP instead of the CPU. The processor may be realized by combining multiple types of arithmetic processing units such as a CPU, an MPU, and a GPU. The processor may be realized as a system on chip (SoC). Further, various processing units may be realized by using FPGA or ASIC. The various programs may be stored in a non-transitional substantive recording medium. Various storage media such as HDD, SSD, flash memory, and SD card can be adopted as the medium of storing the program. DFP is an abbreviation for Data Flow Processor. SoC is an abbreviation for System on Chip. FPGA is an abbreviation for Field Programmable Gate Array. ASIC is an abbreviation for Application Specific Integrated Circuit. HDD is an abbreviation for Hard Disk Drive. SSD is an abbreviation for Solid State Drive. SD is an abbreviation for Secure Digital.

Figure 21:
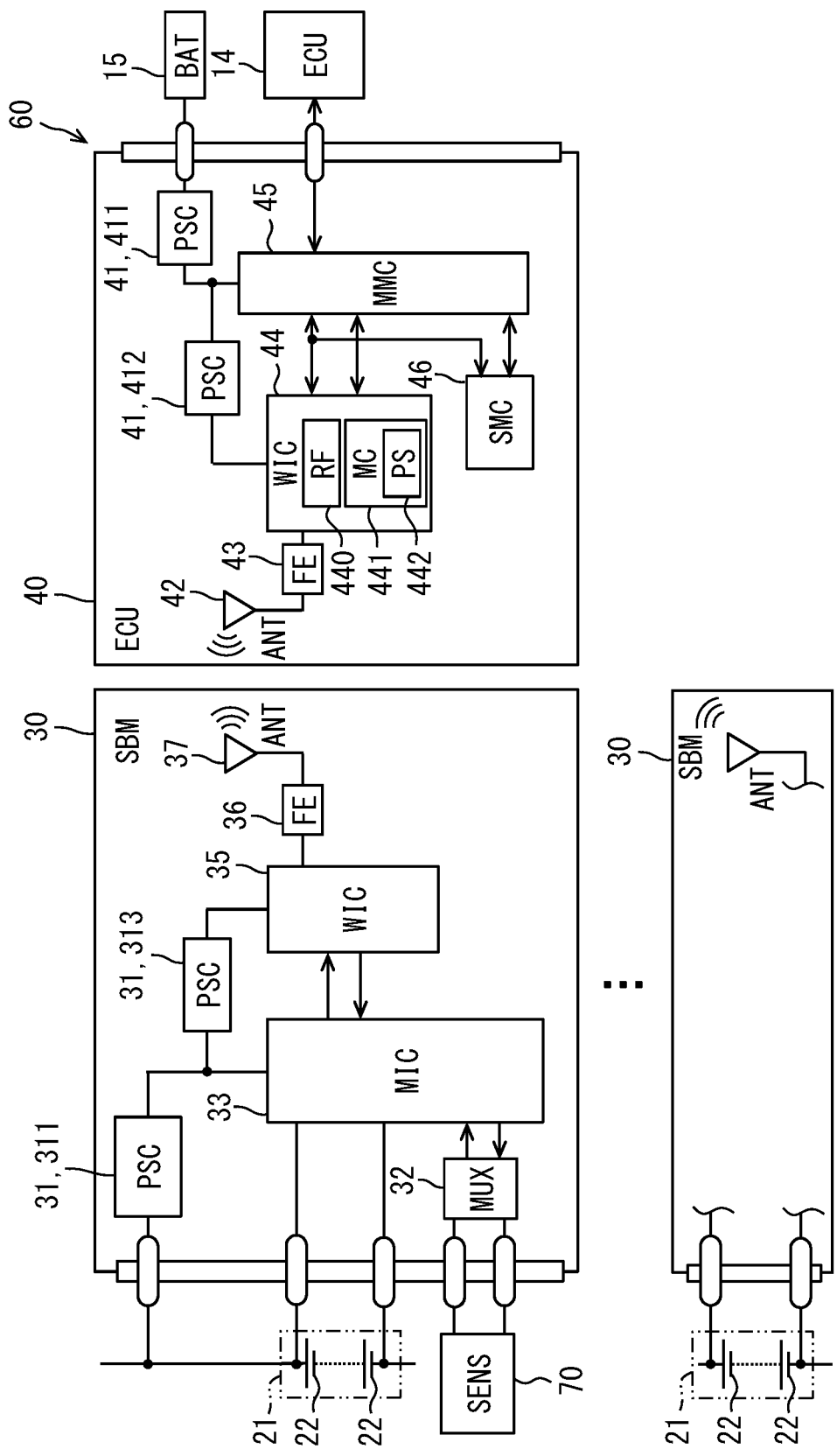
FIG. 21 is a block diagram showing a battery management system according to a modification.

For example, an example in which the monitoring device 30 includes the microcomputer 34 has been described, but the present disclosure is not limited thereto. As shown in FIG. 21, a battery management system 60 in which the monitoring device 30 does not include the microcomputer 34 may be adopted. FIG. 21 corresponds to FIG. 4. In this configuration, the wireless IC 35 transmits and receives data to and from the monitoring IC 33. The wireless IC 35 may execute the sensing by the monitoring IC 33 and the schedule control of the self-diagnosis, or the main microcomputer 45 of the control device 40 may execute the schedule control.

The arrangement and number of the battery stacks 21 and the battery cells 22 constituting the assembled battery 20 are not limited to the above example. In the battery pack 11, the arrangement of the monitoring device 30 and/or the control device 40 is not limited to the above example.

An example has been described in which the battery pack 11 includes one control device 40, but the present disclosure is not limited thereto. The battery pack 11 may include multiple control devices 40. The battery pack 11 has only to include multiple monitoring devices 30 and one or more control devices 40. The battery management system 60 may include multiple sets of wireless communication systems constructed between the control device 40 and the multiple monitoring devices 30.

An example has been described in which the monitoring device 30 includes one monitoring IC 33, but the present disclosure is not limited thereto. The monitoring device 30 may include multiple monitoring ICs 33. In this case, the wireless IC 35 may be provided for each of the monitoring ICs 33, or one wireless IC 35 may be provided for the multiple monitoring ICs 33.

An example of arranging the monitoring device 30 for each of the respective battery stacks 21 has been shown, but the present disclosure is not limited thereto. For example, one monitoring device 30 may be arranged for multiple battery stacks 21. Multiple monitoring devices 30 may be arranged for one battery stack 21.

An example has been described in which the wireless IC 44 includes the microcomputer 441, but the present disclosure is not limited thereto. The wireless IC 441 may have a configuration without the microcomputer 441. The main microcomputer 45 may provide a part of the above-described functions of the wireless IC 44. For example, the wireless IC 35 may be configured not to include a microcomputer. The microcomputer 34 may provide a part of the above-described functions of the wireless IC 35.

What is claimed is:

1. A battery management system comprising:
   a plurality of monitoring devices, disposed in a housing that accommodates a battery of a vehicle, that monitor battery information indicating a state of the battery; and
   a control device that performs wireless communication with each of the plurality of monitoring devices and that acquires data including the battery information to execute a predetermined process, wherein
   the control device further sets a cycle in which the control device performs wireless communication with each of the plurality of monitoring devices in turn,
   the cycle includes a data communication period in which the control device acquires the battery information from one or more of the plurality of monitoring devices with which connection is established and a non-communication period other than the data communication period, and
   the control device adjusts the cycle.

2. The battery management system according to claim 1, wherein
   in response to determining that a predetermined condition is satisfied, the control device extends the non-communication period as compared with a case where the predetermined condition is not satisfied, and
   in the non-communication period, the control device executes a communication establishment process to establish communication with one or more of the plurality of monitoring devices that is disconnected.

3. The battery management system according to claim 2, wherein
   in response to determining that the predetermined condition is satisfied, the control device extends the non-communication period by extending a length of time of the cycle as compared with the case where the predetermined condition is not satisfied.

4. The battery management system according to claim 2, wherein
   in response to determining that the predetermined condition is satisfied, the control device extends the non-communication period by shortening the data communication period in the cycle as compared with the case where the predetermined condition is not satisfied.

5. The battery management system according to claim 2, wherein
   in a case of performing data communication with a part of the plurality of monitoring devices and performing a scanning operation to connect with another part of the plurality of monitoring devices, the control device extends the non-communication period as compared with a case of performing data communication with all of the plurality of monitoring devices.

6. The battery management system according to claim 2, wherein
   the control device further acquires the battery information from each of the plurality of monitoring devices in order to calculate at least one of an internal resistance and an open voltage of the battery, and
   in response to determining that a number of times of acquiring the battery information from a first monitoring device in the plurality of monitoring devices is less than a predetermined number of times in a predetermined period, the control device
   extends the non-communication period as compared with a case of performing data communication with all of the plurality of monitoring devices, and
   performs a scanning operation to reconnect with the first monitoring device.

7. The battery management system according to claim 5, wherein
   in response to determining that there is a high possibility that the state of the battery fluctuates significantly, the control device extends the non-communication period in the cycle as compared with a case where there is a low possibility that the state of the battery fluctuates significantly.

8. The battery management system according to claim 2, wherein
   the control device extends the non-communication period during non-traveling of the vehicle as compared with during traveling of the vehicle.

9. A battery management system comprising:
   a plurality of monitoring devices disposed in a housing that accommodates a battery of a vehicle, each of the plurality of monitoring devices including a monitor microcomputer that monitors battery information indicating a state of the battery; and
   a control device including a control microcomputer that sets a cycle in which the control microcomputer performs wireless communication with each of the plurality of monitoring devices in turn, the cycle including a data communication period in which the control microcomputer acquires the battery information from one or more of the plurality of monitoring devices with which connection is established and a non-communication period other than the data communication period, and
   adjusts the cycle based on whether or not a predetermined condition is satisfied.

10. The battery management system according to claim 9, wherein
    the control microcomputer
    in response to determining that the predetermined condition is satisfied, extends the non-communication period as compared with a case where the predetermined condition is not satisfied, and
    in the non-communication period, executes a communication establishment process to establish communication with one or more of the plurality of monitoring devices that is disconnected.

* * * * *